United States Patent [19]

Cairns

[11] Patent Number: 5,794,131
[45] Date of Patent: Aug. 11, 1998

[54] REDUCING OR ELIMINATING RADIO TRANSMITTER MIXER SPURIOUS OUTPUTS

[75] Inventor: Steven G. Cairns, Louisburg, N.C.

[73] Assignee: Ericsson Inc., Research Triangle Park, N.C.

[21] Appl. No.: 617,605

[22] Filed: Mar. 19, 1996

[51] Int. Cl.$^6$ ............................ H04B 1/40
[52] U.S. Cl. ............... 455/76; 455/112; 455/315; 455/183
[58] Field of Search ................... 455/75, 76, 112, 455/118, 119, 260, 313, 315, 316, 317; 345/1

[56] References Cited

U.S. PATENT DOCUMENTS

| | | | |
|---|---|---|---|
| 2,186,068 | 1/1940 | Hammond et al. | 250/17 |
| 2,245,385 | 6/1941 | Carlson | 250/20 |
| 2,431,212 | 11/1947 | Varone | 250/13 |
| 3,121,221 | 2/1964 | Sullivan et al. | 343/5 |
| 3,350,645 | 10/1967 | Kahn | 325/137 |
| 3,378,774 | 4/1968 | Leypold | 325/184 |
| 3,569,836 | 3/1971 | Deen | 325/123 |
| 3,628,154 | 12/1971 | Weill | 325/435 |
| 4,352,210 | 9/1982 | Puckette | 455/317 |
| 4,545,072 | 10/1985 | Skutta et al. | 455/183 |
| 4,661,995 | 4/1987 | Kashiwagi | 455/183 |
| 4,723,306 | 2/1988 | Fuenfgelder et al. | 455/103 |
| 4,870,699 | 9/1989 | Garner et al. | 455/76 |
| 4,879,758 | 11/1989 | DeLuca et al. | 455/296 |
| 4,905,305 | 2/1990 | Garner et al. | 455/183 |
| 4,932,072 | 6/1990 | Toko | 455/76 |
| 5,109,532 | 4/1992 | Petrovic et al. | 455/63 |
| 5,163,181 | 11/1992 | Koontz | 455/103 |
| 5,179,728 | 1/1993 | Sowadski | 455/183.1 |
| 5,230,094 | 7/1993 | Kitching et al. | |
| 5,355,524 | 10/1994 | Higgins | 455/82 |
| 5,410,747 | 4/1995 | Ohmagari et al. | 455/118 |
| 5,461,344 | 10/1995 | Adoh | 331/1 |

FOREIGN PATENT DOCUMENTS

| | | |
|---|---|---|
| 63-214122 | 10/1985 | Japan. |
| 63-155807 | 6/1988 | Japan. |
| 3-201723 | 9/1991 | Japan. |

OTHER PUBLICATIONS

Bain, E-Systems, ECI Division, *RF Design*, "rf featured technology—A Mixer Spurious Plotting Program," 8 pages, May 1989.

Product Specification, Philips Semiconductors RF Communications Products, "I/Q transmit modulator," pp. 002–015, Dec. 1, 1993.

Archer, et al., *IEEE Journal of Solid-State Circuits*, vol. SC-16, No. 4, "A Broad-Band UHF Mixer Exhibiting High Image Rejection over a Multidecade Baseband Frequency Range" pp. 385–392, Aug. 1981.

*Electrical Communiction*—vol. 45, No. 4, "Z. Bilyk," ITT Communications Division Nutley, New Jersey, pp. 352–357, 1970.

(List continued on next page.)

*Primary Examiner*—Reinhard J. Eisenzopf
*Assistant Examiner*—Darnell R. Armstrong
*Attorney, Agent, or Firm*—Nixon & Vanderhye P.C.

[57] ABSTRACT

In radio transmitting equipment that develops a carrier frequency using a mixer, techniques are used to "shift" or "hide" spurious mixer outputs so that they do not significantly degrade spectral purity of the transmitter output. These techniques generally involve establishing a predetermined frequency relationship between the two signals inputted to the transmitter mixer (TXIF (VCO) and TXLO) in addition to the relationship required to provide the desired difference frequency when the two signals are mixed in the mixer. By establishing a certain predetermined frequency relationship between these two signals it is possible to precisely locate the frequencies of the undesirable mixer output products so that they can be filtered out and/or fall onto the desired output frequency. While generally applicable, these techniques provide special advantages in equipment in which other considerations constrain the design of the transmitter circuitry and frequency inputs thereto.

21 Claims, 16 Drawing Sheets

OTHER PUBLICATIONS

Ray, *Radio & Electronics World*, "Part 1, Automatic Modulation Meter," pp. 58–62, Nov. 1981.

Product Information, Cushman Electronics, Inc., "Multi-Channel FM Communications Monitor CE-7, A multichannel FM communications monitor for mobile and point-to-point radios," USA, 4 pages, Mar. 1973.

| FIG. 5A | FIG. 12B |

| | | |
|---|---|---|
| $F_{OUT}$ = 130 -145 | TXIF = 120 | (TXLO = 250 - 265) |
| $F_{OUT}$ = 145 -149 | TXIF = 115 | (TXLO = 260 - 264) |
| $F_{OUT}$ = 149 -153 | TXIF = 118 | (TXLO = 267 - 271) |
| $F_{OUT}$ = 153 -163 | TXIF = 112 | (TXLO = 265 - 275) |
| $F_{OUT}$ = 163 -173 | TXIF = 120 | (TXLO = 283 - 293) |
| $F_{OUT}$ = 173 -174 | TXIF = 111 | (TXLO = 284 - 285) |

1

REDUCING OR ELIMINATING RADIO TRANSMITTER MIXER SPURIOUS OUTPUTS

FIELD OF THE INVENTION

This invention relates to radio frequency (RF) transmitters, and more particularly to reducing or eliminating spurious output signals generated by mixing within a radio transmitter mixer. Still more particularly, the present invention relates to reducing undesirable effects of transmitter mixer spurious products by "hiding" and/or "shifting" the spurious signals so they do not degrade the spectral purity of the transmitter's output.

BACKGROUND AND SUMMARY OF THE INVENTION

A radio transmitter generates radio frequency (RF) signals at a desired frequency. The signals produced by the radio transmitter are typically coupled to a radio antenna, which radiates the signals into space in the form of electromagnetic waves. The radiated electromagnetic waves can be received by a receiving antenna and "detected" by the electrical circuits within an appropriately tuned radio receiver.

Just as musical notes can have different "pitches," radio signals can have different frequencies. Different radio transmitters use different frequencies to avoid interfering with one another. A guitar player can turn a tuning peg to change the pitch a string sounds—and similarly, it is possible to "tune" a radio receiver to control the frequency the radio receiver receives. In a given area, the Federal Government assigns a unique radio frequency to each radio and television broadcast station. A person interested in radio or television station WXYZ, for example, tunes his or her radio (or television) receiver to that station's frequency. "Tuning" in this context means controlling the receiver to "select" the particular radio frequency of the desired station and to "reject" all other radio frequencies.

In the early days of radio, all radio signals were transmitted at relatively low radio frequencies. Because of overcrowding of the lower end of the frequency spectrum and for other reasons (e.g., greater susceptibility to noise such as from lightning crashes), people began exploring and using higher radio frequencies such as "VHF" ("Very High Frequency") and "UHF" ("Ultra High Frequency"). However, it is more difficult to build radio receiver circuits that work well at higher frequencies. This problem was solved in part by using an arrangement called "superheterodyne."

"Superheterodyne" allows received higher frequency signals to be processed at a lower frequency. "Superheterodyne" incorporates a "mixer" into the radio receiver. The mixer "down converts" higher frequencies to lower frequencies that can be processed more easily. A "mixer" is a non-linear circuit that mixes two signals of different frequencies together to produce one or more products at new frequencies. A "mixer" circuit actually produces several "new" products: one is the sum of the two input frequencies, and the other is the difference between the two input frequencies.

In a modern "superheterodyne" receiver, the received radio signal $F_2$ is applied to one input of the mixer. See FIG. 1. A variable-frequency "local oscillator" signal $F_1$, sometimes called an "injection signal," is applied to another input of the mixer—which may be a single sideband demodulator mixer for example. Modern "digital" radio receivers usually employ a "frequency synthesizer" "phase locked loop" to generate this variable local oscillator signal. The mixer circuit "mixes" the two inputs together to produce both "sum" $(F_1+F_2)$ and "difference" $(F_1-F_2)$ "image" signals as shown in FIG. 1. An "intermediate frequency" filter it the mixer circuit output passes only one product (e.g., the "difference" frequency) and rejects the other product.

Mixers are common in radio receivers because of their ability to down convert. Some radio transmitters also use mixers to develop radio transmit signals. For example, some types of transmitters use mixers to "modulate" (i.e., superimpose) speech or other intelligence onto a radio "carrier" frequency signal. In addition, a trend in modem radio communications equipment toward miniaturization and compactness has led land mobile and other radio designers in the direction of radio "transceivers"—a single piece of equipment that can both transmit and receive. To reduce overall cost, size and complexity, the transmitting and receiving sections of such transceivers generally share circuitry—including the "frequency synthesizer" used to produce internal local oscillator signals. Since most commercial two-way radios transmit and receive on different but related frequencies (i.e., the transmit frequency may be "offset" from the receive frequency by a predetermined frequency spacing), such sharing is often very convenient and cost-effective. For these and other reasons (e.g., increased RF output-to-VCO isolation), some radio designers have adopted a mixer, as part of their radio transmitter design, to develop transmit output frequencies from the same (or related) frequency synthesizer outputs used to generate receiver local oscillator signals.

FIG. 2 is an example of a conventional simplified prior art "two-way" radio transceiver 50 using mixers for transmitting and receiving. In radio transceiver 50, the same antenna 52 is used both for radiating radio signals over the air to other radio equipment 51 and for receiving radio waves transmitted over the air. The transceiver shown is "half duplex," meaning that it can transmit and receive on different frequencies but can not do both simultaneously. An antenna switch 54 selects between receive ("RX") and transmit ("TX"), or the radio could be "full duplex" (so it can transmit and receive simultaneously) if the antenna switch is replaced with a filter network ("duplexer").

In the receive position, switch 54 connects the received signal "RFIN" from antenna 52 through an RF amplifier 56 (and associated "preselector" filter) to one input of a mixer 58. An "RXLO" receiver local oscillator signal produced by a frequency synthesizer 60 is connected to the other input of mixer 58. The mixer 58 develops both "sum" and "difference" frequency products (e.g., RXLO+RFIN and RXLO−RFIN). The mixer output is passed through an "intermediate frequency" ("IF") section 62 typically comprising filters and amplifiers. In this particular example, IF section 62 rejects the RXLO +RFIN "sum" component of the mixer 58's output (as well as RFIN and RXLO), and passes only the "difference" signal RXLO−RFIN. This filtered signal is "detected" by a detector 64 that extracts intelligence ("modulation") from the received signal. The detected output may be further processed depending on its type. For example, speech signals may be amplified by an audio amplifier 66 and provided to a loud speaker 68 for conversion into sound waves 70.

The FIG. 2 radio transceiver 50 generates an RFOUT signal for transmission using a transmit mixer 80. Mixer 80 receives, as inputs, a transmit local oscillator signal TXLO and an "offset" or "intermediate" frequency TXIF. TXIF may be produced, for example, by a transmit local oscillator 82 such as a voltage controlled oscillator connected in a phase locked loop. The TXLO may be produced by frequency synthesizer 60, and may, for example, be derived from the same RXLO signal used as a receiver mixer injection signal. The output of mixer 80 is filtered by filter 83 to remove the undesired mixer product (i.e., TXLO+ TXIF when TXLO−TXIF is desired), and is provided to modulator 78. Filter 83 may be incorporated into the mixer chip, and is commonly implemented using SSB type mixers.

Radio transceiver 50 receives a modulation input such as sound waves 72 from a microphone 74. After suitable amplification by an amplifier 76 and further processing, such as for example, conversion from analog to digital form using a CODEC, modulator 78 applies the resulting intelligent signal to the carrier signal outputted by mixer 80. Analog modulation could be accomplished by applying the analog audio signal to VCO 82 if desired. The modulated carrier signal is amplified by a power amplifier 86 and coupled through switch 54 to antenna 52.

To increase miniaturization and for other reasons, radio designers commonly make use of application-specific integrated circuit ("ASIC") products as "building blocks" for designing radio transceivers such as shown in FIG. 2. For example, Philips Semiconductors manufactures a single-chip high performance, multi-function transmit modulator ASIC part number SA900 that is particularly suitable for use in cellular and other radio applications. This SA900 product is described in the Philips product specification entitled "I/Q Transmit Modulator SA900" (No. 853-1720 11504 Dec. 1, 1993). Briefly, this monolithic transmit modulator provides both analog (AMPS) mode and complex, I/Q quadrature digital (NADC IS54) mode modulation functions—and is especially suited for use in the FIG. 2 transceiver 50. This SA900 product is designed for the 800 MHz and 900 MHz bands, but is also capable of operating at lower frequencies.

FIG. 3 is a block diagram of the Philips SA900 transmit modulator device 100. Device 100 provides a phase locked loop synthesizer 102 including a voltage controlled oscillator 104 and a phase detector 106. The phase detector compares the VCO 104 output to a reference signal produced by a crystal oscillator circuit 108. Crystal oscillator 108 may be driven by an external reference signal or operated from an external crystal. The phase detector 106 provides a charge pump output that is used to drive an external second order loop filter (not shown) connected to "PHSout." The output of the loop filter is used to provide the control voltage to VCO 104 ("TANK$_{13}$1, " TANK$_{13}$2") to complete the PLL frequency synthesizer.

The following is a brief description of how conventional device 100 of FIG. 3 works. The VCO 104 output is provided to the input of a programmable divide-by-N ("/N") divider 110 with user selectable divides of 6, 7, 8, and 9. The output of divider 110 drives another divider 112 that selectively divides by 8 or 1 depending on a control bit input. The output of divider 112 is fed to one input of phase detector 106. A reference input for phase comparator 106 generated by crystal oscillator 108 (which may be driven by an external reference frequency applied to the XTAL$_{13}$1 input) is divided by a divider 114 that programmably divides by 8 or 1.

Phase detector 106 compares the reference signal to the VCO 104 output phase to generate a charge pump output current proportional to phase error. The resulting VCO frequency is:

$$VCO=REF_{IN} \cdot N \qquad (1)$$

where "REF$_{IN}$" is the reference frequency provided by or through crystal oscillator 108 and "N" is the division ratio of divider 110.

The output of VCO 104 is applied to an input of a mixer 116 along with an externally sourced TXLO signal (which is buffered/limited by amplifier 118 and low pass filtered by filter 120). The arrangement selects the difference product output of mixer 116 (using functionality equivalent to an image reject filter 122 shown) to generate the transmit carrier signal from the "lower sideband." The lower sideband modulated signal drives the AMPS power amplifier 124 after further low pass filtering by low pass filter 126.

For the digital quadrature modulation ("I/Q") mode, device 100 must be provided with I ("in phase") and Q ("quadrature") differential baseband modulator input signals. A phase shift network 128 at the output of image of reject filter 122 provides mixer output signals in quadrature (i.e., one signal is phase shifted by 90 degrees relative to the other)—although in this example, the quadrature components produced by mixer 116 are not combined so the phase shift network 128 is for conceptual use only. These quadrature signals are low pass filtered by low pass filters 126 and 130, respectively before being multiplied with the I and Q modulation input signals by modulation mixers 132, 134. The outputs of mixers 132, 134 are summed by summer 136. A variable gain amplifier 138 and a power amplifier 140 further process the summed signal to provide the digital mode modulated output.

The FIG. 3 device, which was designed primarily for cellular radio telephones, provides adequate spectral output purity when operated in its 800–900 MHz "design bands". However, unlike many cellular radiotelephones, a land-mobile radio unit may need to operate over a variety of different bands including for example the VHF band (e.g., 136–174 MHz) and the UHF band (e.g., 403–470 MHz and 450–512 MHz). When the FIG. 3 device is operated in these lower frequency ranges, it produces significant spurious outputs that seriously degrade the spectral purity of the transmitter output. The spectral purity problems are attributable to at least the following factors:

The 800–900 MHz design bands of device 100 encompass relatively small percentage bandwidths, allowing spurious products to be avoided with judicious choices of frequencies;

such judicious frequency choices cannot eliminate spurious outputs at lower operating frequencies, with wider percentage bandwidths.

The design bands are significantly (octaves) higher in frequency than the VHF bands—and any internal matching or filtering appears to be at the wrong frequency for lower operating frequencies.

The radio services at the 800–900 MHz design bands have legal spectral purity requirements that are, in general, more relaxed than those applying to VHF and UHF land mobile radio services.

Investigation into the spurious content of the output of the FIG. 3 device has revealed that the majority of the undesirable spectral components are due to what is sometimes referred to as "Able Baker" spurs. These are generated when the internal mixer 116 mixes the TXIF VCO output and the TXLO signals and their harmonics. As shown in FIG. 1, the transmit mixer 116 produces "sum" and "difference" "image" signals. However, the mixer's non-linear characteristics also result in many additional, undesired "spurious products" ("spurs")—and in particular, it will also produce "sum" and "difference" frequencies of all of the harmonics (integer multiples) of each of the input frequencies. The output of FIG. 3's transmit mixer 116 is thus more accurately represented by the following equation:

$$F_{spur}= \pm N*TXIF \pm M*TXLO \qquad (2)$$

where N and M are integer multipliers and N+M is the "order" of the spurious output signal $F_{spur}$.

It is known in the prior art to carefully choose the TXIF and TXLO signals to reduce or eliminate the number of "spurs" within the transmitter output passband. (Herein "TXFF" is used to refer to the mixer injection signal, which is actually "VCO" in the FIG. 3 example.) Since the difference in frequency between TXIF and TXLO is what yields the desired carrier frequency, it is possible to make the absolute frequencies of TXIF and TXLO anything convenient so long as the frequency difference between them is as required.

An article by Richard Bain entitled "A Mixer Spurious Plotting Program" published in RF Design at pages 32–43 (May 1989) discusses how to identify problematic spurious signals produced by a transmitter mixing circuit. The article discussed a computer program that may be used to plot spurious responses to determine whether they fall inside or outside of the passband of a filter following the mixer output. The article recommends making such a plot to identify spurious mixer products that are close to the desired frequency output of the mixer. The article recommends that once these spurious outputs have been identified, the radio designer should determine (based on mixer charts published by mixer manufacturers) what the amplitudes of the identified spurious signals will be. The article further recommends that once this information is known, the radio designer or system analyst can "choose an optimum frequency plan for the system being designed so as to avoid or minimize the effect of undesirable spurious signals."

FIG. 4 is a plot, made using the computer program as described in the *RF Design* article, of the VHF band (130 MHz–180 MHz) with a TXIF (VCO) injection frequency of 115.2 MHz for mixer product order (N+M) less than 16. The lines on the plot are labeled alphabetically from "A" to "S" to correspond to the following values of N and M:

TABLE I

|   | N   | M  |
|---|-----|----|
| A | –11 | +5 |
| B | –10 | +5 |
| C | –9  | +4 |
| D | –8  | +4 |
| E | –7  | +4 |
| F | –6  | +3 |
| G | –5  | +3 |
| H | –3  | +2 |
| I | –1  | +1 |
| J | +3  | –1 |
| K | +4  | –1 |
| L | +5  | –2 |
| M | +6  | –2 |
| N | +7  | –2 |
| O | +8  | –3 |
| P | +9  | –3 |
| Q | +10 | –4 |
| R | +11 | –4 |
| S | +12 | –4 |

The points labeled $x_1$–$x_{12}$ in FIG. 4 correspond to the following spurious signal levels (–dBc) measured at the output of the FIG. 2 device:

TABLE II $x_1 = -44$ dBc
$x_2 = -75$ dBc
$x_3 = -75$ dBc
$x_4 = -86$ dBc

TABLE II-continued $x_5 = -60$ dBc
$x_6 = -76$ dBc
$x_7 = -94$ dBc
$x_8 = -61$ dBc
$x_9 = -52$ dBc
$x_{10} = -67$ dBc
$x_{11} = -68$ dBc
$x_{12} = -50$ dBc This FIG. 4 plot shows that several spurious signals of significant amplitude fall on or near the desired output frequency (represented on the plot by the vertically-centered horizontal line labeled "T"). For example, the trace labeled "P" represents a spur of about –50 dBc that crosses the desired output frequency at about 173 MHz but falls within 10 MHz of the desired output frequencies of 170 MHz–175 MHz. These and other spurs shown in the plot create a serious spectral purity problem when the FIG. 3 device is operated in the 130–180 MHz VHF band.

Radio designers have in the past used a variety of techniques to reduce or eliminate undesired spurious signals produced by a transmitter mixer output. Radio designers also know that the frequencies and orders of the various mixer products represented by Equation 2 must be identified to determine whether or not these products will interfere with desired signals in the radio equipment being designed. Since the amplitude of a mixer product decreases exponentially with its "order," for some higher "orders" the amplitude of the corresponding spurious signals is so low as to be negligible. In addition, many or most of the spurious output signals represented by Equation 2 may be removed by a filter at the mixer output (e.g., image filter 122 in FIG. 2). Nevertheless, some mixer products may, depending on various factors, have sufficient amplitude and/or proximity in frequency to the desired mixer output frequency to cause problems even despite such considerations. Thus, mixer output filtering is universally used to eliminate most spurious mixer products (including the undesired image signal) but cannot eliminate the spurious products that are so close in frequency to the desired transmit frequency that they inherently fall within the passband of the mixer output filter.

Improvements can be realized by using a "tracking" bandpass filter at the output of transmitter mixer 80. In such a "tracking" filter arrangement, the center frequency of the mixer output filter is made programmable so that its passband precisely "tracks" the desired mixer output frequency. Thus, when the frequency synthesizer changes the TXIF mixer input signal, the mixer output filter is also controlled to adjust its center frequency to correspond to the new desired mixer output product frequency. The use of a tracking filter allows the filter's passband to be substantially narrower than the range of the desired mixer output frequency. Since this "tracking" filter arrangement can provide a substantially reduced filter bandpass, more spurious mixer products will fall outside of the filter bandpass and can therefore be successfully filtered out.

The tracking filter approach can be successful, but is not always possible to implement in all practical radio designs and may not eliminate all spurious mixer products. In the case of the FIG. 3 device, for example, the mixer output circuitry must have a sufficiently wide passband to pass the modulated signal bandwidth provided at the output of VCO 104 (e.g., about 30 KHz). 10 MHz as the bandwidth of a tracking filter may be chosen, for example, as a practical narrow limit for a simple, low cost mass produced tracking filter. Looking at the FIG. 4 plot reveals that this bandwidth will not eliminate all undesirable spurs. The plot shows that there are many spur crossings that are well within the 10 MHz (or any arbitrarily small) limit.

Thus, none of the conventional known techniques normally used to reduce or eliminate undesired mixer output products are effective to sufficiently reduce spurious outputs from the FIG. 3 circuit when operating in bands (e.g., VHF and UHF) other than its design bands.

I have solved this problem by developing new techniques for reducing or eliminating spurious mixer outputs. My techniques "shift" or "hide" the spurious outputs so that they do not significantly degrade spectral purity of the transmitter output. These techniques generally involve establishing a predetermined frequency relationship between the two signals inputted to the transmitter mixer (TXIF (VCO) and TXLO) in addition to the relationship required to provide the desired difference frequency when the two signals are mixed in the mixer. By establishing a certain predetermined frequency relationship between these two signals, it is possible to precisely locate the frequencies of the undesirable mixer output products so that they can be filtered out and/or fall onto the desired output frequency.

In accordance with one aspect of a preferred example of my invention, I relate the TXIF frequency and the TXLO frequency by division so that the undesirable spurious mixer components are placed "underneath" the desired frequency output. For example, in one example arrangement, I provide the following relationship between TXLO and TXF:

$$TXIF=TXLO/K$$

where K is an integer and may be, for example, 3 or 4. Due to this harmonic relationship between the TXLO and TXIF frequencies, potentially troublesome spurious mixer outputs fall onto the desired mixer frequency output—and are thus no longer "spurious" frequencies. By establishing this relationship between TXLO and TXIF, it is possible to eliminate all spurs given by equation (2) above of significance within an arbitrary frequency range (e.g., ±50 MHz of the carrier frequency). Depending on the modulator used, this technique will hide the spur under the desired signal or—since it is now on channel—reduce its suppression requirement. In other words, when this spur hiding technique is used with an SSB or quadrature modulator, the "hidden" spur will now be located at the location of the suppressed carrier. The modulator should suppress the "hidden" spur by an equal amount (dB) as carrier. This technique thus greatly reduces suppression requirements (e.g., from −76dBc to −35dBc in one example implementation using the FIG. 3 device).

In accordance with another aspect of an example of my invention, I dynamically change the TXIF and TXLO frequencies with transmit operating frequency to move spurs out of the operating frequency range and into another part of the band where they can be more easily filtered by the standard mixer output filter. Because the transmitter desired output depends on the difference between the input signal frequencies (i.e., the relative rather than absolute frequencies), it is possible to generate any arbitrary desired mixer output frequency using a wide variety of different combinations of input frequencies. Using this approach, it is possible to select different mixer input frequency combinations for different segments of the operating band. The radio equipment can automatically select a suitable input frequency combination optimized to reduce spurious outputs on the portion of the operating band currently being used. For example, when operating in the VHF frequency range of 130 to 180 MHz, it may be optimal or useful to use a TXIF (VCO) input frequency of 153.6 MHz at either end of the band and TXIF (VCO) input frequency of 134.4 MHz at the middle of the band. This approach does not eliminate spurious mixer outputs, but instead shifts the frequency of those outputs to different frequencies sufficiently far away from the desired operating frequency so that they are filtered out using the mixer output filter.

BRIEF DESCRIPTION OF THE DRAWINGS

These and other features provided by the invention will be better and more completely understood by referring to the following detailed description of presently preferred example implementations in conjunction with the drawings of which.

DETAILED DESCRIPTION OF PRESENTLY PREFERRED EXAMPLE IMPLEMENTATIONS

Basic Overall Example Radio Transceiver Design

Figure 5A:
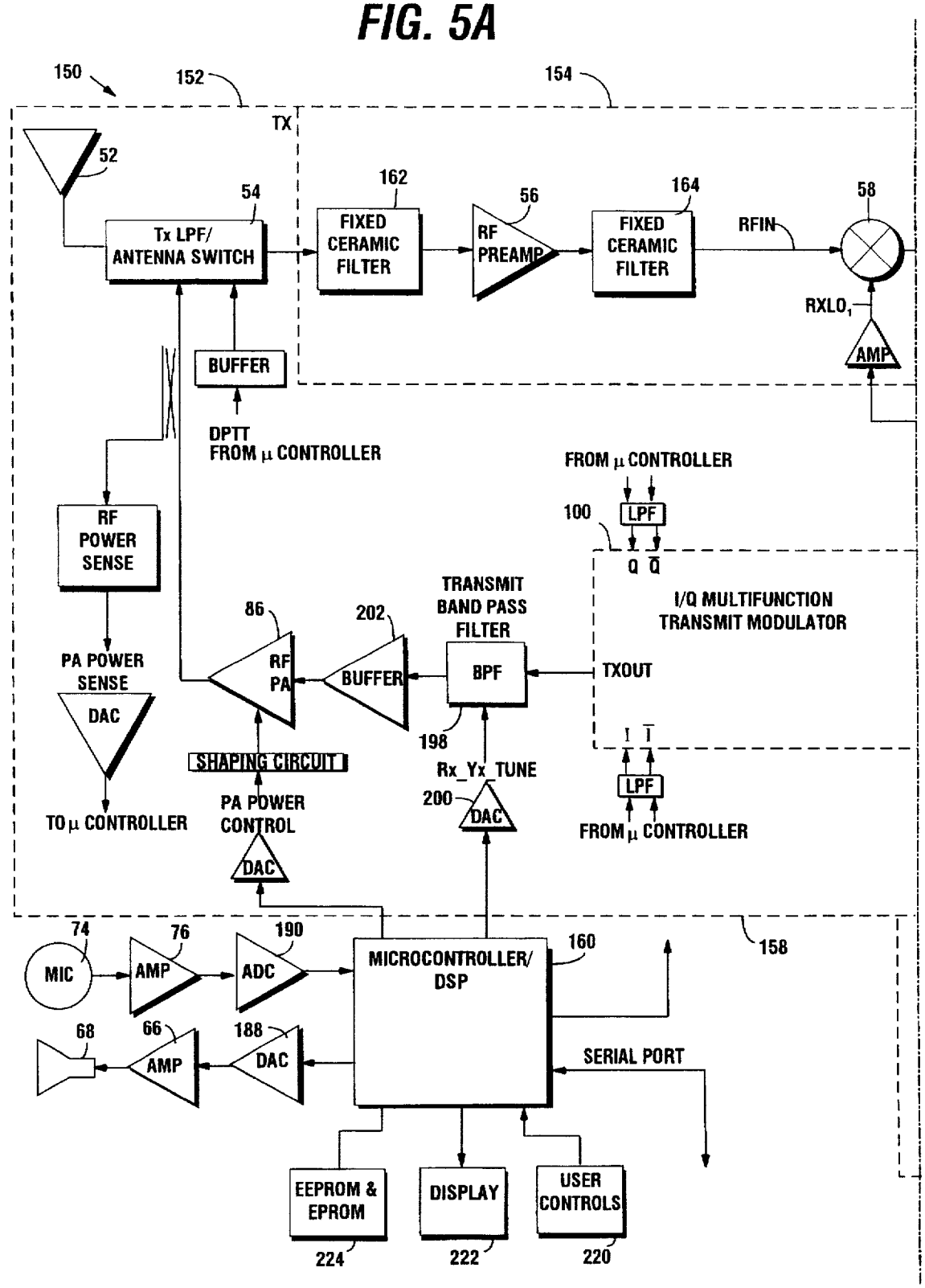
FIGS. 5a and 5b are together a block diagram of an example radio transceiver that embodies aspects of the present invention.
Figure 5B:
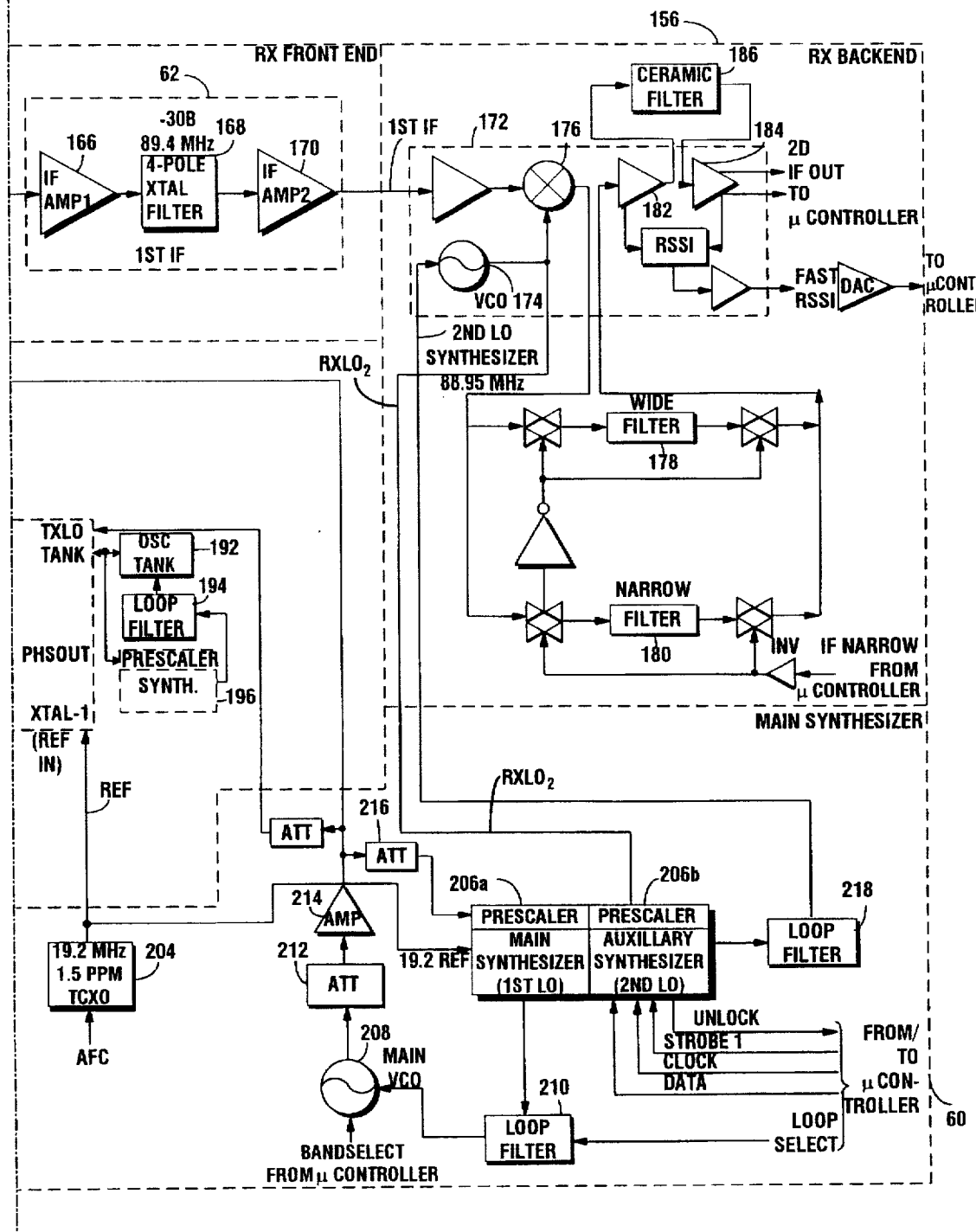

FIGS. 5a and 5b together show a block diagram of an example dual mode mobile/portable radio transceiver 150. Transceiver 150 is a synthesized, wideband radio using microcomputer technology to provide high reliability, high quality and high performance in two way, analog (FM) and digital communications. Details concerning this example radio design may be found, for example, in U.S. patent application Ser. No. 08/359,691 to Janky et al. filed 20 Dec., 1994 entitled "Analog FM to Digital TDMA Migration" (Attorney Docket No. 46-797).

Briefly, transceiver 150 includes a transmit section 152, a receiver "front end" section 154, a receiver "back end" section 156, a main synthesizer section 60, a transmit modulator section 158, and a controller/DSP section 160. In this example, an antenna switch 54 selectably couples antenna 52 to the receiver front end section 154 or to transmitter section 152.

Receiver front end section 154 and back end section 156 together comprise a dual conversion superheterodyne receiver including a preselector filter 162, an RF preamplifier 56, and a further preselector filter 164 that provide a full-frequency RFIN signal to the input of first receiver mixer 58. An RXLO local oscillator injection signal provided by main synthesizer 60 results in mixer 58 down-converting the RFIN signal to a first IF frequency for processing by IF section 62. In this example, IF section 62 includes an RF amplifier 166 followed by a bandpass crystal filter (e.g., with a center frequency of 89.4 MHz) 168 and a further IF amplifier 170. This first IF signal output by IF section 62 may be provided to the input of a Philips SA637 receiver chip 172 with internal VCO 174. The primary purpose of receiver chip 172 is to down-convert the first IF signal to a second IF signal (e.g., at about 450 KHz) and to provide adjustable bandpass filtering increasing receiver selectivity. Receiver chip 172 in this example includes an internal mixer 176 that mixes the first IF signal with a second local oscillator injection signal (e.g., at a frequency of about 88.95 MHz) to down-convert a first IF signal to a second, lower IF frequency. In this example, a programmable filter network including selectable "wide" and "narrow" filters 178, 180 filter the second IF signal before amplification by IF amplifiers 182, 184 and further filtering by a ceramic filter 186.

The filtered second IF signal is provided to a digital signal processor within microcontroller/DSP section 160 for digital demodulation, audio filtering and other processing. Microcontroller/DSP processes this signal and converts it (using a digital-to-analog converter 188) to an analog audio signal for amplification by amplifier 66 and conversion to sound waves by loudspeaker 68. Microcontroller/DSP also controls all of the programmable components shown in FIGS. 5a and 5b—including the various operating modes of transmit modulator 100 and the prescaler and synthesizer operating parameters of components 206a, 206b. Microcontroller/DSP 160 interacts with a user via user controls 220 and a conventional LCD display 222, and executes code stored in non-volatile memory 224 (e.g., in EEPROM) which it uses to control its operating functions.

Figure 1:
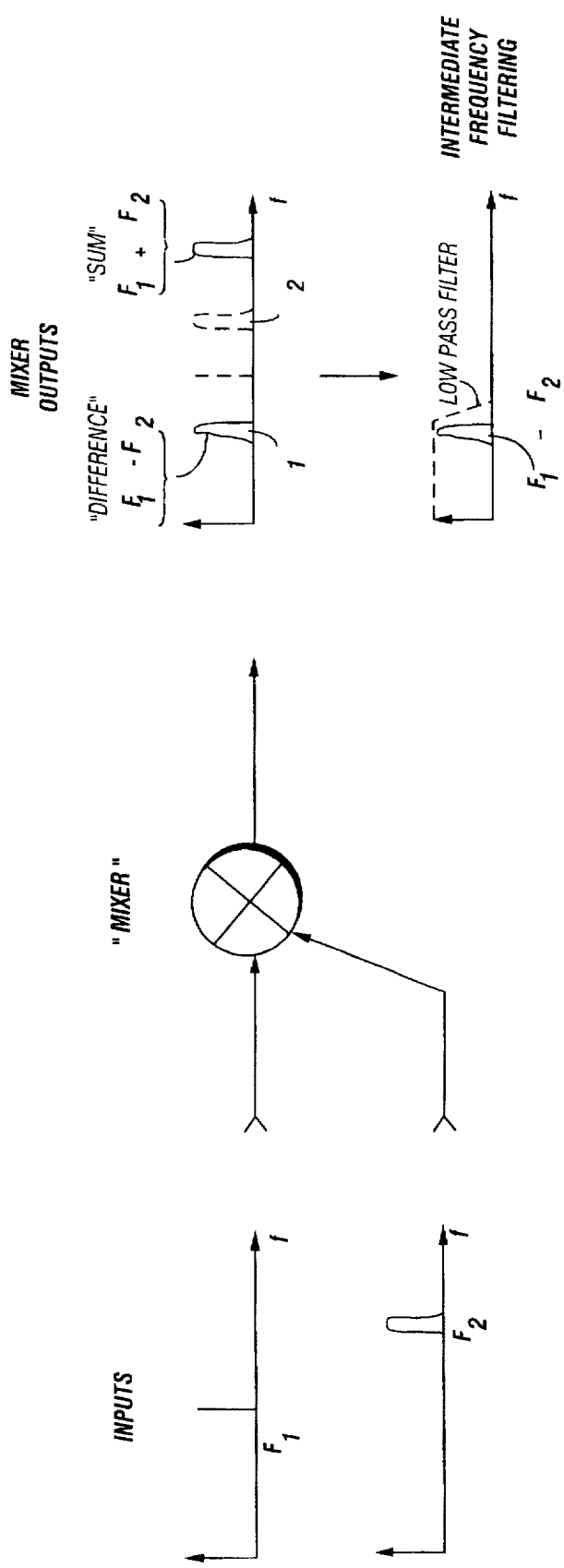
FIG. 1 is a conceptual diagram showing how a basic mixer works.
Figure 2:
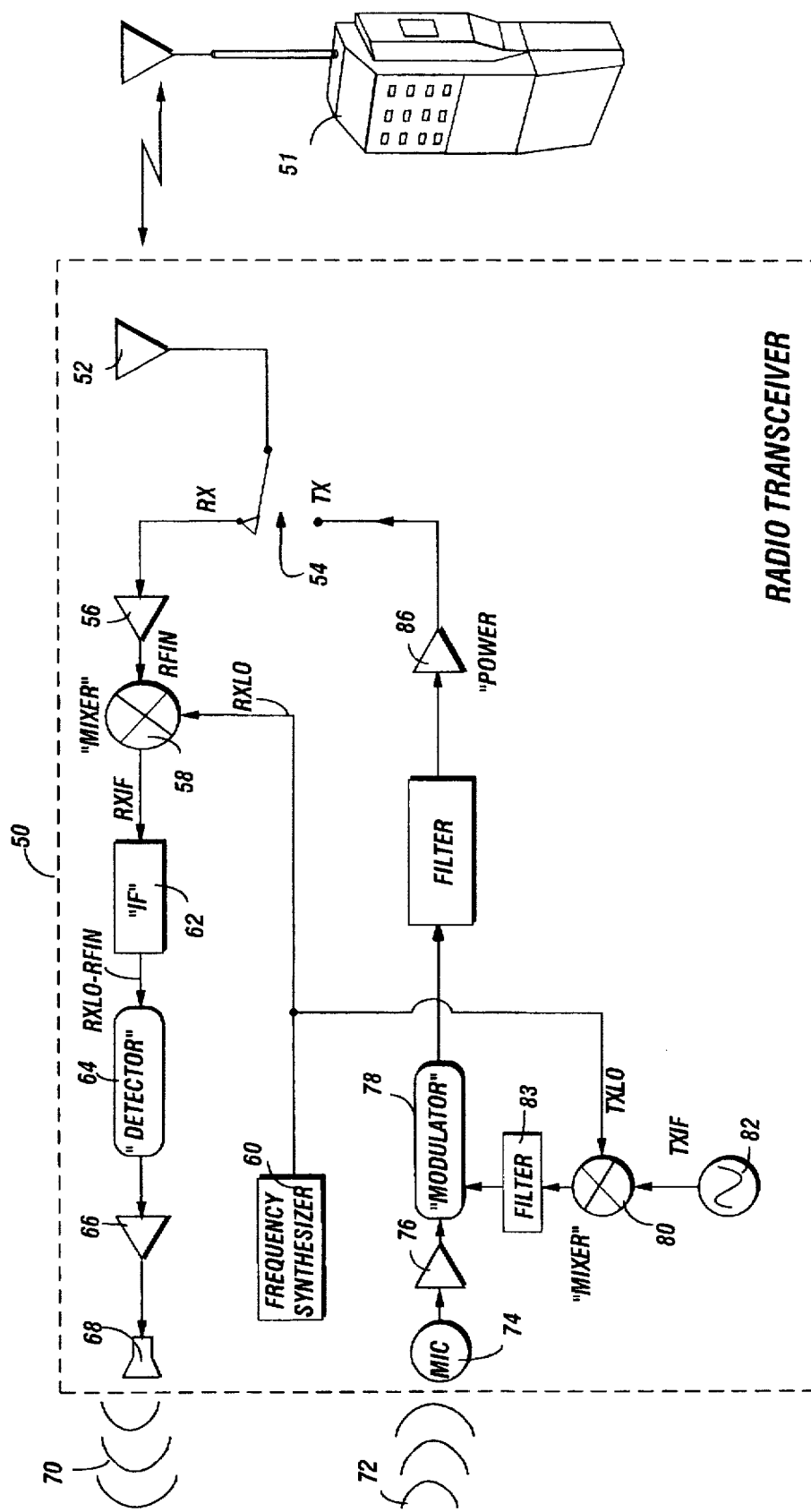
FIG. 2 shows an example prior art radio transceiver using a mixer to generate transmit frequencies.
Figure 3:
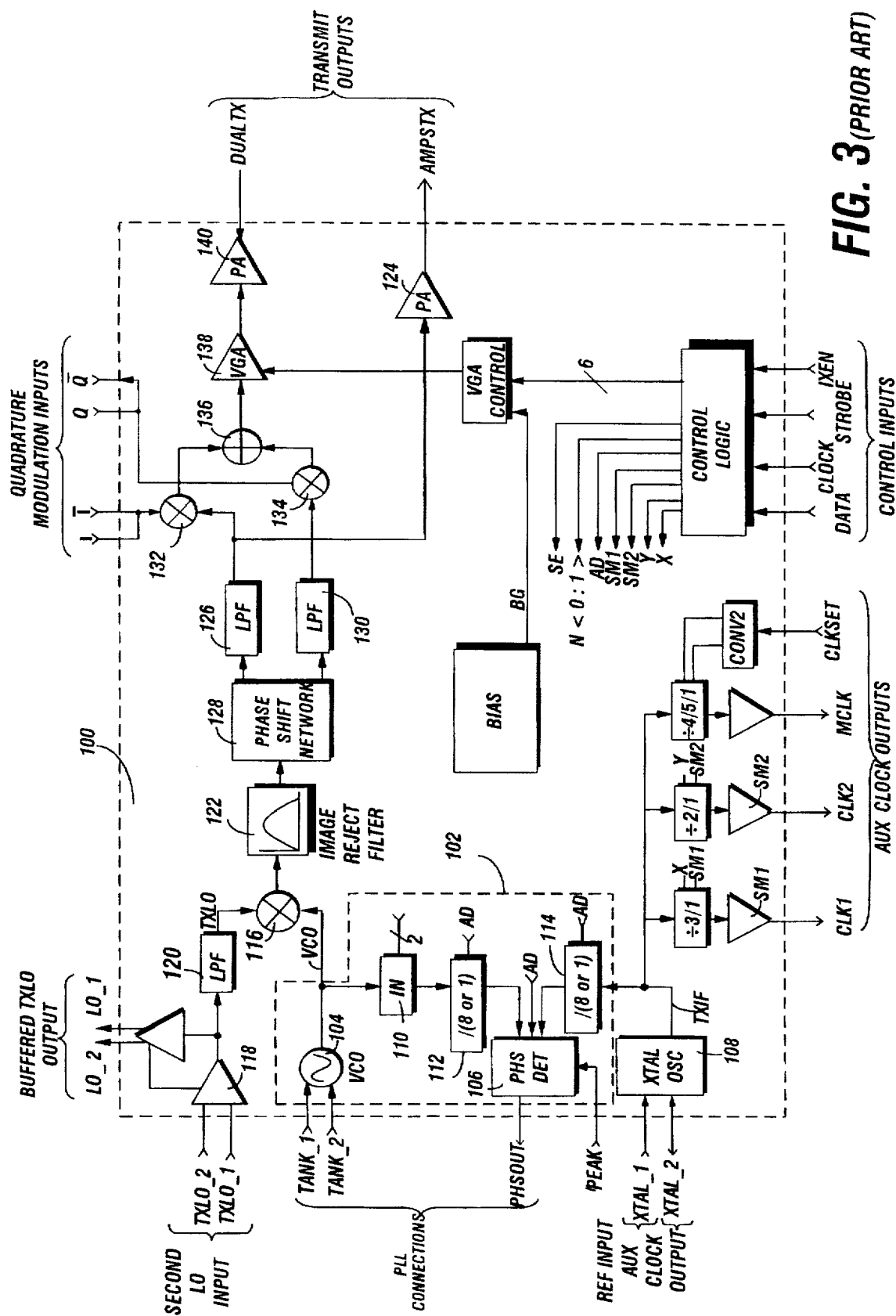
FIG. 3 is a block diagram of a prior art transmit modulator device.

In this example, the sound waves received by microphone 74 are amplified by audio amplifier 76 and converted into digital form by analog-to-digital converter process 190 (including, for example, digital signal processor and recoding steps to process voice and insert timing data) before being processed (e.g., limited, bandpass filtered, etc.) by digital filtering and other processors within microcontroller/DSP 160. Microcontroller/DSP 160 provides differential modulation signals in quadrature to the I and Q inputs of I/Q multi-function transmit modulator 100. Transmit modulator 100 generates an RF carrier signal as explained above in connection with FIG. 3, utilizing an external conventional tank circuit 192, loop filter 194 and optional internal divider or optional prescaler/synthesizer 196 to form a PLL. The modulated output produced by transmit modulator 100 is filtered by a transmit bandpass filter 198 that is preferably programmable to "track" the output frequency (bandpass filter 198 may be programmed via a digital-to-analog converter 200 controller by microcontroller/DSP 160). The filtered modulated output signal from bandpass signal 198 is amplified by a buffer amplifier 202 and is then amplified by power amplifier 86 before being provided to antenna 52 via antenna switch 54.

Synthesizer 60 produces the receiver first mixer 58 injection signal $RXLO_1$, and also controls the second receiver mixer 176 injection signal $RXLO_2$. In addition, the same synthesizer 60 produces the TXLO transmit local oscillator signal. The TXIF signal is produced by oscillator tank 192, loop filter 194 (and synthesizer 196 when used). In this example, synthesizer 60 is built around a highly stable (e.g. crystal-control) reference oscillator 204 producing a reference signal at 19.2 MHz with stability of at least 1.5 PPM. In this example, the reference signal is provided directly to the $XTAL_{13}1$ input of transmit modulator 100 to drive the transmit modulator's internal crystal oscillator circuit 108 (see FIG. 3). In addition, this 19.2 MHz reference signal is provided to the input of a main synthesizer/prescaler arrangement 206 (which in this example may comprise half of a Philips SA7025 dual synthesizer chip). In this example, the second receiver local oscillator injection signal $RXLO_2$ is generated by VCO 174 within the receiver chip 172. The VCO 174 frequency is controlled by the other half 206b of the SA7025 dual synthesizer chip and associated loop filter 218.

Main synthesizer/prescaler 206a provides a programmable division factor to divide the 19.2 MHz reference signal down to a desired frequency value in selectable increments under control of microcontroller/DSP 160. The main synthesizer 206a also includes a dual output fractional N type phase detector in this example that compares the output phase/frequency of a main VCO 208 with the reference frequency. The phase detector output is fed back to control main VCO 208 in a conventional phase-locked-loop arrangement via a conventional programmable loop filter 210. The main VCO 208 output is attenuated by an attenuator 212, amplified by a buffer amplifier 214, and further attenuated by another attenuator 216 before being provided to the input of prescaler portion of prescaler/main synthesizer 206a.

The main VCO 208 output in this example is used both as the $RXLO_1$ first receiver mixer 58 injection signal, and as the TXLO transmit local oscillator signal. This signal is primarily used to select and change the operating channel/band.

"SPUR" SHIFTING USING TRANSMIT MODULATOR INTERNAL DIVIDER

As shown in FIGS. 5a and 5b, the example transceiver transmit modulator 100 includes an internal programmable "/N" divider 110 (see FIG. 3) that divides the VCO 104 output TXIF down to a lower frequency for comparison with the 19.2 MHz reference signal provided to the input of internal crystal oscillator 108. A judicious choice of frequencies cannot always be found to eliminate troublesome mixer spurious outputs as the percentage of operating bandwidth to center frequency increases. One possible solution is to change the transmit mixer 116 input frequencies as a function of operating frequency. The programmable divider 110 included within the transmit modulator 100 used in this example might be used to perform programmable frequency division depending upon operating frequency.

Given the 19.2 MHz reference frequency output of main reference oscillator 204, the following VCO output frequencies 104 result from different "/N" factors for internal divider 110:

| N | TXIF (MHz) |
|---|---|
| 1 | 19.2 |
| 2 | 38.4 |
| 3 | 57.6 |
| 4 | 76.8 |
| 5 | 96.0 |
| 6 | 115.2 |
| 7 | 134.4 |
| 8 | 153.6 |
| 9 | 172.8 |

Because of limitations in the VCO 104 operating range in this particular example (90 MHz to 140 MHz), only the N=5, N=6, N=7 (and possibly N=8) factors appear to be usable (and this particular Philips SA–900 part in this example can only use N=6, N=7, N=8 or N=9). For reasons of switching speed and TXLO tuning range, it is desirable to have the TXIF close in frequency to the RXIF (+/–a fixed T/R offset). Thus, in this example the RXIF=89.4 MHz and the T/R offset is 45 MHz. It is desirable (for stability and speed of operation) that the TXLO signal be as close in frequency as possible to the RXLO frequency. This is because the same main synthesizer/prescaler 206a is used to derive both TXLO and RXLO. It takes a finite amount of time (including loop settling time) to switch between two different frequencies, this amount of time generally increasing as the difference between the two frequencies increases. In a half-duplex radio transceiver 150, the transceiver is constantly switching back and forth between transmit and receive mode—and it is desirable that this switch over occurs as rapidly as possible. Therefore, it is important to ensure that the synthesizer 60 switching speed between transmit and receive operation occurs as rapidly as possible.

If possible, frequencies are chosen such that TXLO= RXLO to avoid any synthesizer frequency changes between transmit and receive. In a half duplex system, this may be done by making TXIF-[$F_{RX}$-$F_{TX}$]=RXIF. In a simplex system ($F_{RX}$=$F_{TX}$), this reduces to TXIF=RXIF. If a radio must work both for half duplex and simplex, or if the half duplex split is not constant, then the synthesizer must rapidly switch between the two frequencies. This method was considered for VHF and UHF, where there is no absolute relationship between TX and RX frequencies. In this case, it is necessary to move the frequency of the main synthesizer between TX and RX. Hence, there is not a requirement to link the TXLO and RXLO frequencies. At 800 and 900 MHz, there is a fixed relation between $F_{TX}$ and $F_{RX}$ and designers try to make TXLO=RXLO at a given channel.

Accordingly, TXIF=153.3 MHz and TXIF=172.8 MHz are probably not acceptable in this particular example. TXIF=134.4 MHz might be a candidate in an 800 MHz radio for example, where 134.4 MHz=45 MHz+89.4 MHz and 45 MHz is the transmit/receive split (to provide TXLO=RXLO on any given channel).

Figure 4:
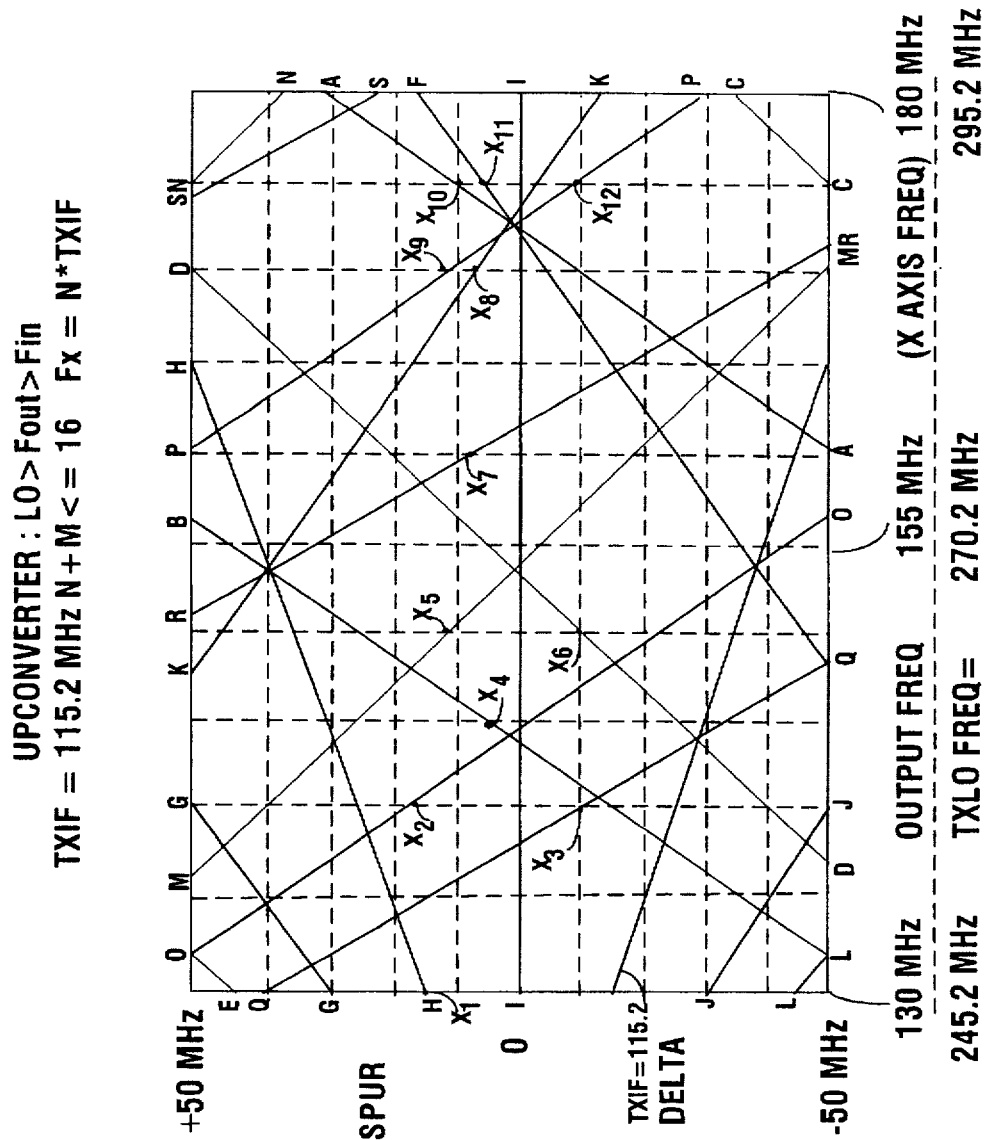
FIG. 4 is a plot showing example mixer spurious products.

FIG. 4 discussed above shows the spur plot for N=6 (TXIF=115.2 MHz). Changing N to 5 (TXIF=96 MHz) yields the FIG. 6 spur plot for the VHF range 130–180 MHz. The lines on the plot are labeled alphabetically from "A" to "U" to correspond to the following values of N and M:

TABLE III

|   | N | M |
|---|---|---|
| A | –11 | +5 |
| B | –10 | +4 |
| C | –10 | +5 |
| D | –9 | +4 |
| E | –8 | +4 |
| F | –7 | +3 |
| G | –6 | +3 |
| H | –4 | +2 |
| I | –3 | +2 |
| J | –1 | +1 |
| K | +4 | –1 |
| L | +5 | –1 |
| M | +6 | –2 |
| N | +7 | –2 |
| O | +8 | –3 |
| P | +8 | –2 |
| Q | +9 | –3 |
| R | +10 | –3 |
| S | +11 | –4 |
| T | +11 | –3 |
| U | +12 | –4 |

Figure 6:
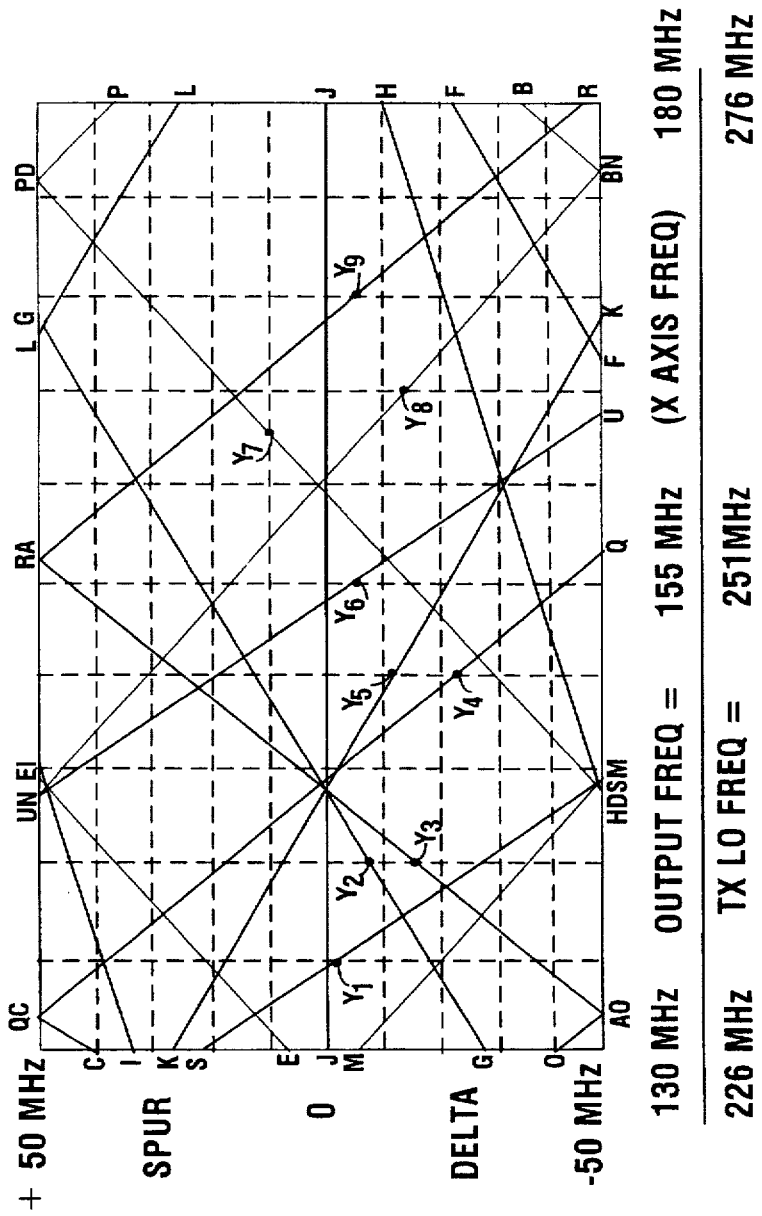
FIG. 6 shows an example plot of shifted (with regard to FIG. 4) spurious mixer outputs resulting from a frequency-shifted transmit IF and TXLO frequency.

The points labeled $y_1$–$y_9$ correspond to the following spurious signal levels (–dBc) measured at the output of the FIG. 6 device:

TABLE IV

| |
|---|
| y1 = –92 dBc |
| y2 = –67 dBc |
| y3 = –66 dBc |
| y4 = –57 dBc |
| y5 = –56 4Bc |
| y6 = –80 dBc |
| y7 = –84 dBc |
| y8 = –81 dBc |
| y9 = –76 dBc |

Figure 7A:
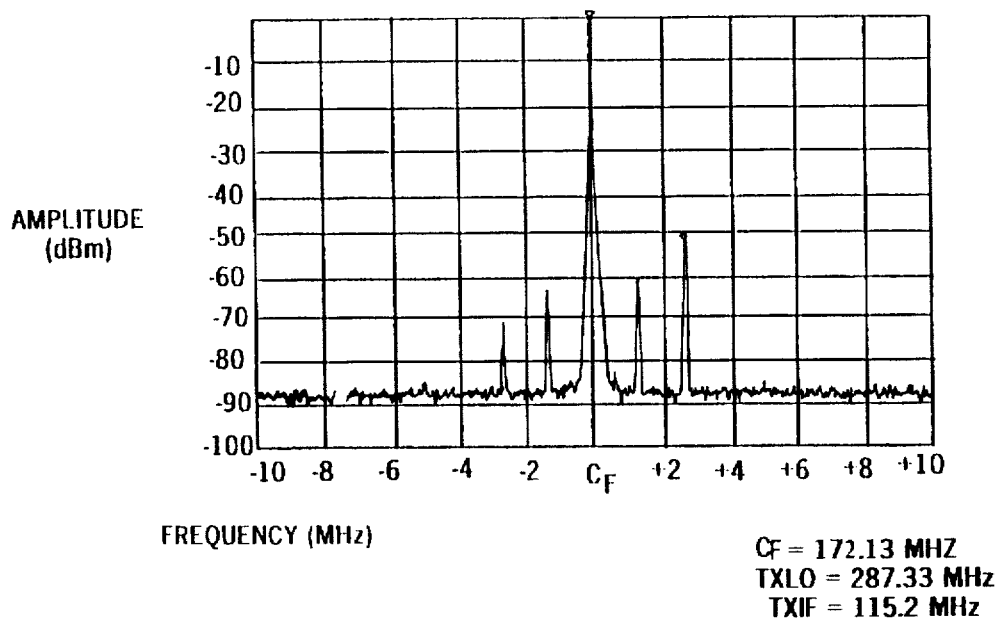
FIGS. 7a and 7b show measured spectra of the FIG. 5a, 5b transceiver output using TXIF local oscillator frequencies corresponding to the plots of FIGS. 4 and 6, respectively.
Figure 7B:
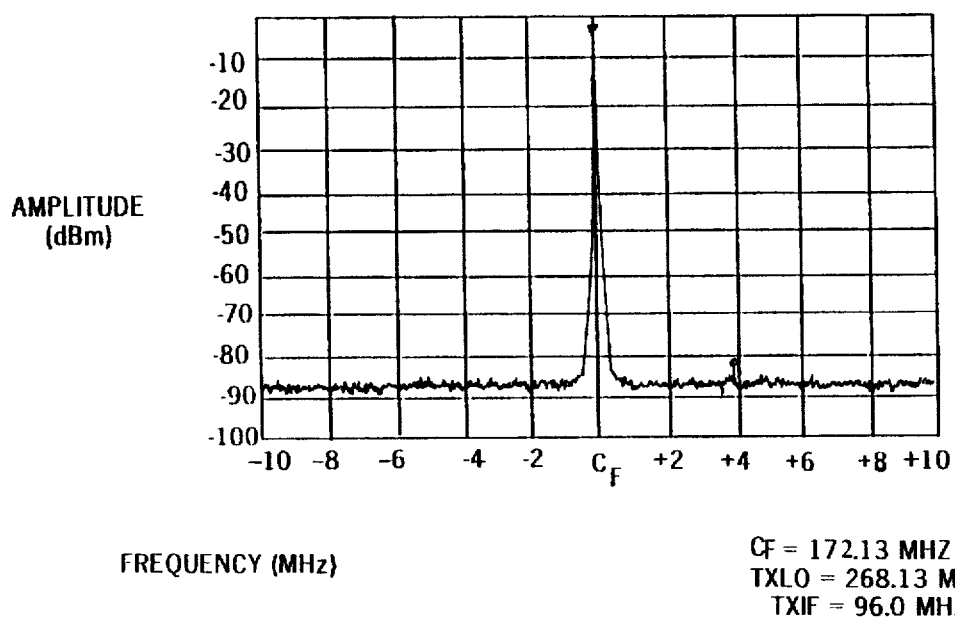

Comparing FIG. 4 to FIG. 6, it can be seen that the pattern of spurious signals has "shifted" so that the spurious signals, while still present, are now at different frequencies. For example, the frequency output segment of 130 MHz–135 MHz is relatively clear of spurious signals in the FIG. 4 example, whereas a spurious signal crosses the output frequency at slightly under 135 MHz output frequency in the FIG. 6 plot. Similarly, the FIG. 4 plot is plagued with spurious output signals at output frequencies of 170 MHz–175 MHz, whereas the FIG. 6 plot is relatively clear of spurious signals in this output band segment. FIGS. 7a and 7b are frequency domain plots (generated by a spectrum analyzer) for a transmitter output frequency of 172.13 MHz using a TXIF=115.2 MHz (prescaler 110 internal division factor N=6) and TXIF=96.0 MHz equivalent to (N=5), respectively. These plots show many spurious outputs measured in the VHF band segment near 170 MHz in the FIG. 7a plot. FIG. 7b shows no significant spurious outputs at the same output frequency using the different TXIF frequency. Thus, changing the TXIF (and TXLO) frequency makes it possible to move the spurious mixer components away from the operating frequency so they can be filtered out and do not degrade spectral output purity of the transmitter.

Figures 8, 12:
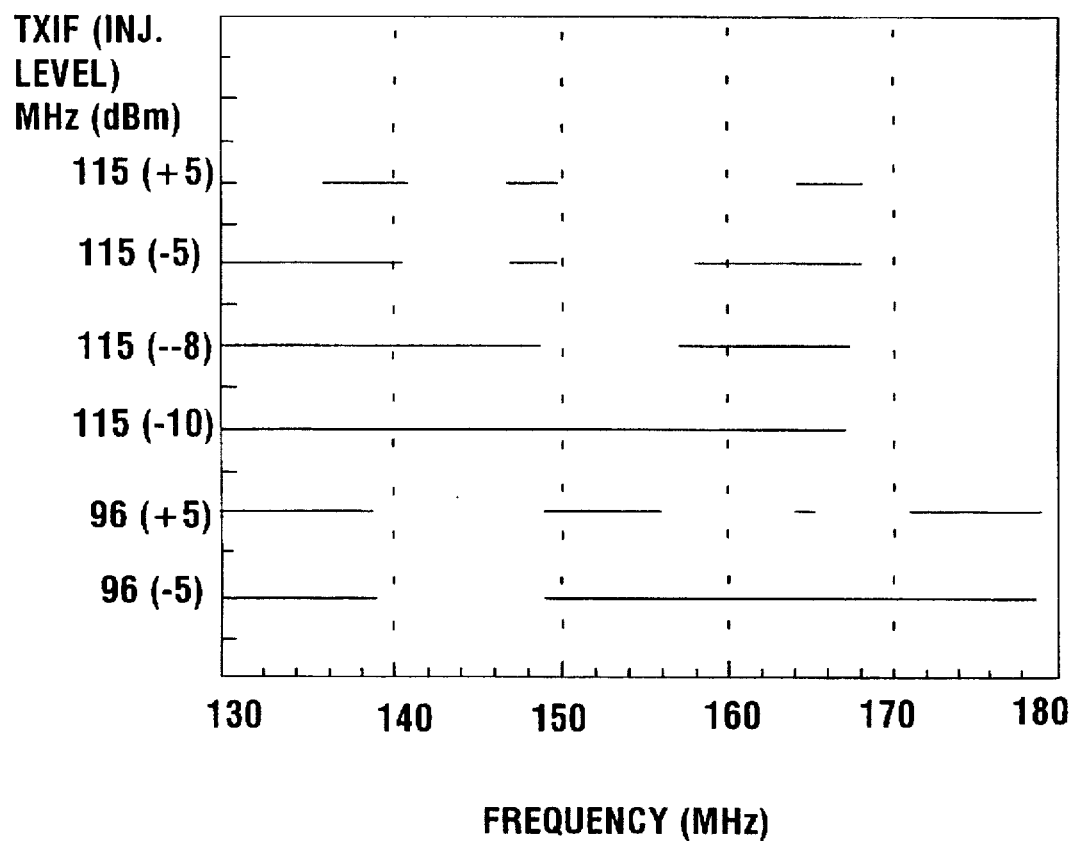
FIG. 8 is a plot of VHF band segments versus spurious mixer outputs for the two different TXIF frequencies (and different mixer input levels) represented by the plots of FIGS. 4 and 6 (the horizontal lines indicate frequency ranges where spurious performance meets example specifications)
FIG. 12 shows how FIG. 12b can be substituted for FIG. 5b to provide a modified radio transceiver.

FIG. 8 shows how the VHF band can be segmented into a number of different band segments to provide ". spur-free" (i.e., all spurs below some arbitrary design level) operating ranges as a function of TXIF level and frequency. The FIG. 8 graph shows, for example, that spur-free operation is obtained with TXIF=96 MHz for the VHF band segments 130 MHz–139 MHz, 149 MHz–156 MHz, 164 MHz–165 MHz, and 171 MHz–179 MHz, whereas spur-free operation using TXIF=115.2 MHz is provided for VHF band segments of 136 MHz–141 MHz, 147 MHz–150 MHz, and 164 MHz–168 MHz. As the FIG. 8 plot shows, it is possible to increase the coverage of these respective spur-free band segments by reducing the TXIF drive level in this example so as to decrease the VCO 104 output level—but this well known technique has other drawbacks. For example, if the TXIF drive level is decreased to −8 dBm for TXIF=115.2 MHz and to −5 dBm for TXIF=96 MHz, it is possible to provide spur-free operation over the entire 130–180 MHz VHF band in two band segments (e.g., use TXF=115 MHz for 130–149 MHz, use TXIF=96 MHz for 149–179 MHz).

Figure 8A:
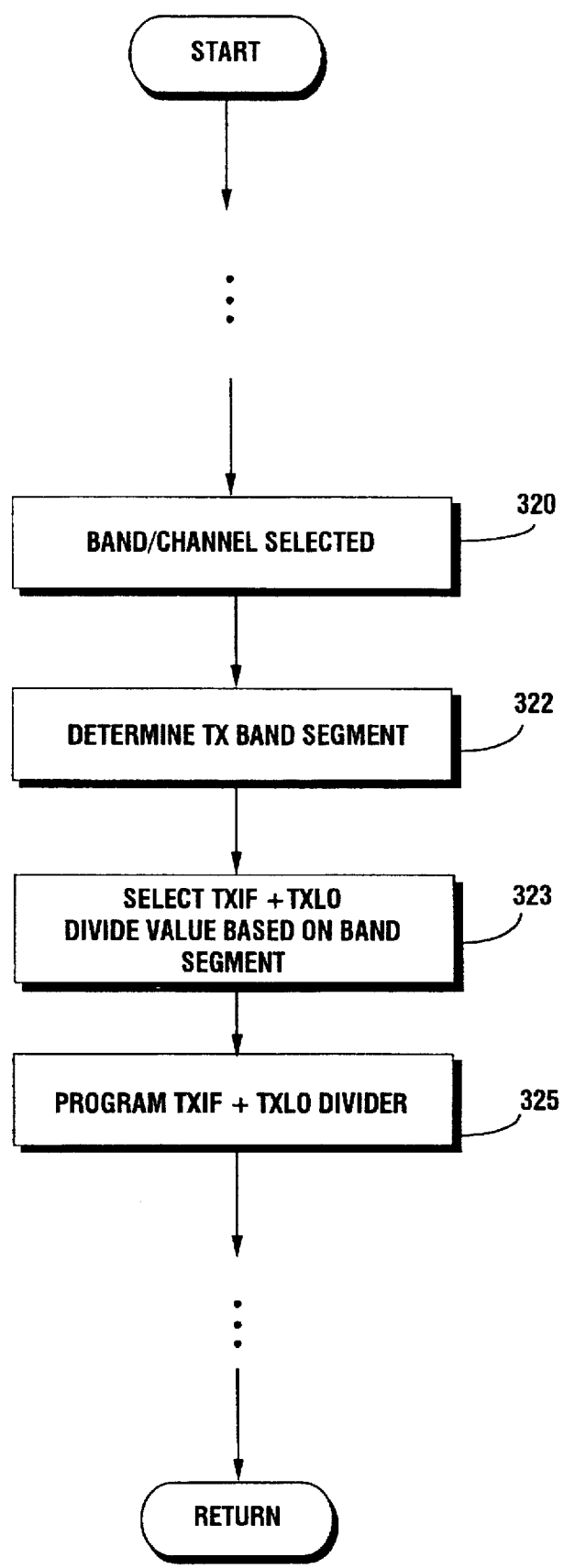
FIG. 8a shows an example flowchart of program control steps performed by the FIG. 5a microcontroller to provide "spur shifting"

FIG. 8A is a flowchart of steps performed by the FIG. 5a microcontroller to implement "spur shifting." In this example, whenever the user selects a different band/channel (block 320), microcontroller/DSP 160 determines which band and band segment the user has selected (block 322). The microcontroller/DSP 160 may then determine, based on the above, which divide value for the "/N" divider 100 to use based on band segment (block 323). Microcontroller/DSP 160 sends programming data to device 100 to appropriately program "N" (block 325), and also controls synthesizer 60 to produce appropriate output frequencies to result in the selected output frequency.

A design limitation in a transmit modulator 100 component used in this example may reduce effectiveness of this approach in some specific applications. As described above, transmit modulator 100 is preferably a Philips SA900 integrated circuit or similar part available from Hewlett-Packard. This particular part allows the "/N" divider 110 to be programmed for N=6, N=7, N=8 and N=9—but not N=5. Thus, to use component 100 to its fullest, it is desirable to modify it in this particular example to provide a capability for divider 110 to divide by a factor of 5.

"SPUR SHIFTING" USING MULTIPLE TXIF FREQUENCIES AND AN EXTERNAL TXIF SYNTHESIZER

Figure 9:
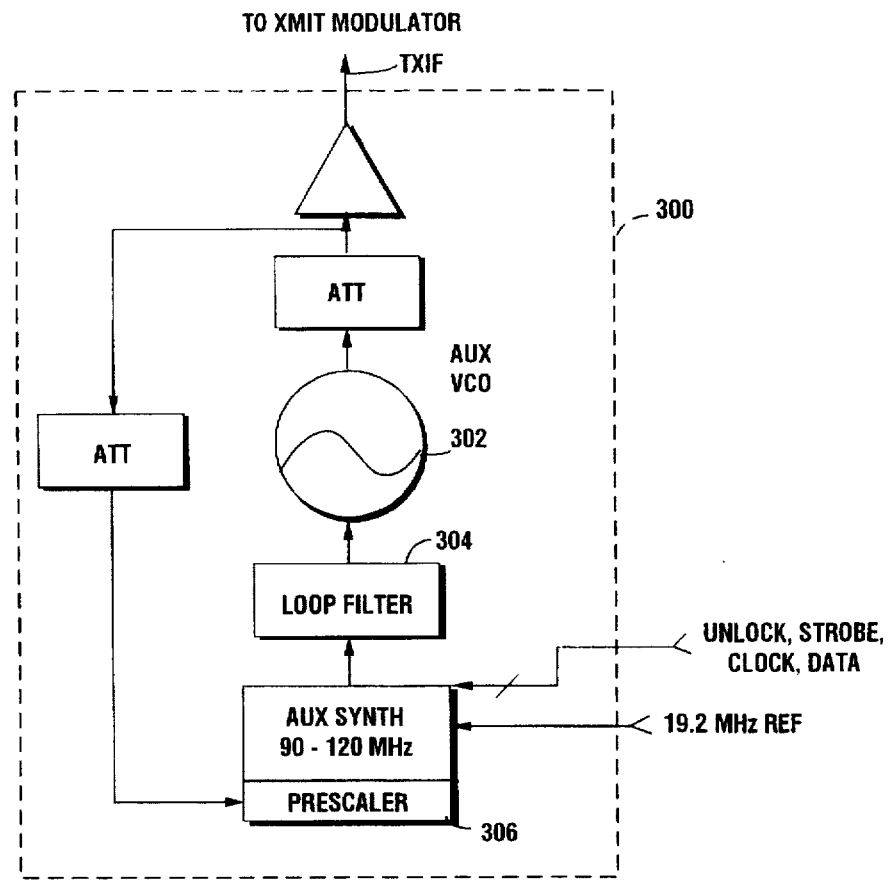
FIG. 9 is a block diagram showing a modification to the transceiver of FIGS. 5a and 5b to provide additional TXIF selections.
Figure 10:
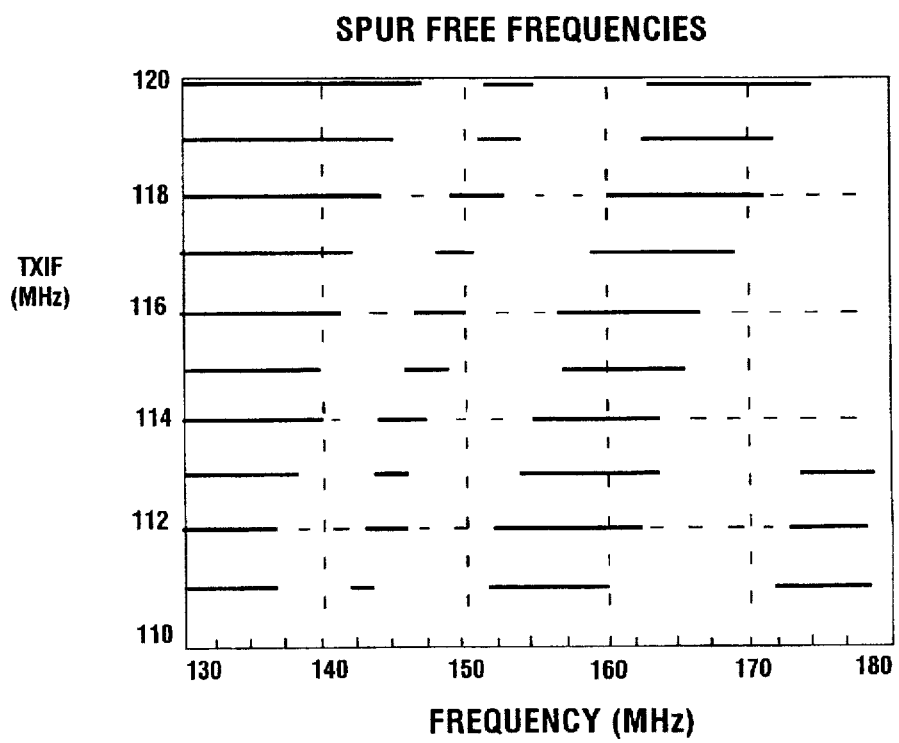
FIG. 10 is a plot of VHF band segment outputs versus TXIF frequencies produced by the transceiver of FIGS. 5a and 5b using the FIG. 9 arrangement (the horizontal lines indicate frequency ranges where spurious performance meets example specifications)

It may be advantageous to generalize the "spur shifting" concept by using external circuitry to expand the choices for TXIF. FIG. 9 shows an example modification to the transceiver 150 shown in FIGS. 5a and 5b providing an external frequency synthesizer 300 instead of internal divider 110 to provide addition flexibility in selecting TXIF. In this example, external synthesizer 300 may be connected to the reference oscillator 204 output and loop filter 194. The same oscillator tank 192 could be used. (The PHSout would not be used, and DATA, CLOCK and $STROB_{13}3$ would control synthesizer 300.) Synthesizer 300 may include an auxiliary VCO 302, a loop filter 304 and an auxiliary synthesizer/prescaler 306 connected in a conventional phase locked loop configuration. The frequency steps of synthesizer 300 can remain rather large (e.g. on the order of a MHz or so), since "fine" control over transmit frequency is provided by main synthesizer 206a. FIG. 10 shows a plot of spur-free operating frequency ranges for the VHF band using, for example, TXIF frequencies of TXIF=111 MHz through TXIF=120 MHz in 1 MHz increments. The FIG. 10 plot was prepared using a common TXIF injection level. With a drive level of −5 dBm, it is possible to cover the entire VHF band "spur-free" with a TXIF tuning range of 110–120 MHz. The larger number of TXIF choices allows more complete "clearing" of the spurs. An additional advantage of this arrangement is that it may be possible to reduce the required tuning range of the main synthesizer 206a (the receiver must still tune the entire range, so unless another technique is found or the receiver tuning range requirement is less, this advantage may not be realizable).

Figures 11A, 11B:
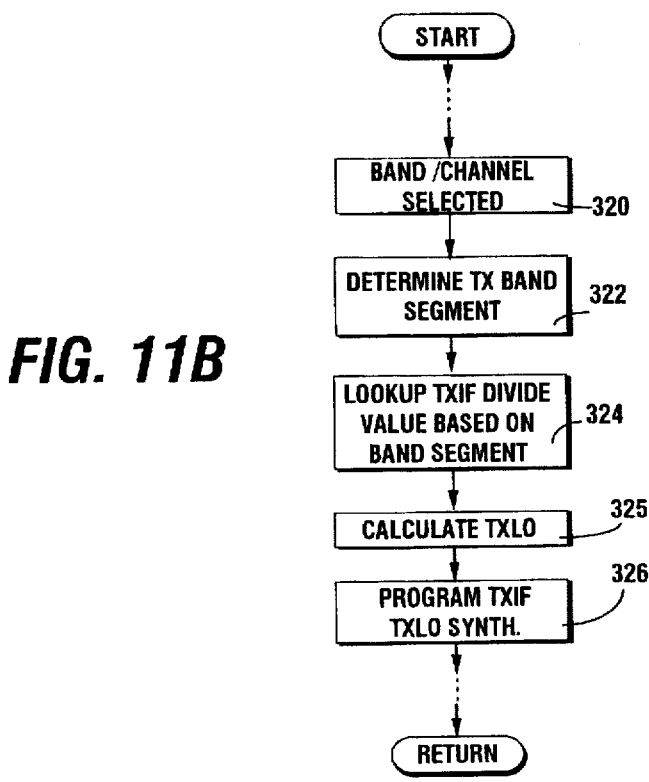
FIG. 11a is an example "spur shifting" lookup table stored in the memory within the FIG. 5a microcontroller.
FIG. 11b is a flowchart of example program control steps performed by the FIG. 5a microcontroller to provide "spur shifting" using an external TXIF synthesizer.

In this example, microcontroller/DSP 160 is used to control the auxiliary synthesizer/prescaler 306 in addition to main synthesizer/prescaler 206a for transmit operation. FIG. 11a shows an example database/lookup table that microcontroller/DSP 160 may store and use to assist it in appropriately programming synthesizer/prescaler 306 of FIG. 9. As shown in FIG. 11a, the VHF output band can be divided into 6 segments, each of which has a record 312 corresponding to a different TXIF frequency (and corresponding TXLO frequency range, which may be calculated each time the channel is changed instead of being explicitly stored in a lookup table).

FIG. 11b shows, in flowchart form, example steps performed by microcontroller/DSP 160 to program the auxiliary synthesizer/prescaler 306 (and main synthesizer/prescaler 206a) for transmit operation. In this example, whenever the user selects a different band/channel (block 320), microcontroller/DSP 160 determines which band and band segment the user has selected (block 322). The microcontroller/DSP 160 may then "look up," in database 310, the desired output frequency $F_{out}$ to find which one of records 312 corresponds to the desired band segment (block 324). Once the appropriate record is found, microcontroller/DSP 160 reads the appropriate TXIF frequency corresponding to the desired band segment from the proper record 312, and also reads (or calculates) the appropriate TXLO operating frequency (blocks 325, 326). Microcontroller/DSP 160 uses these values to program auxiliary synthesizer/prescaler 306 (and main synthesizer/prescaler 206a) to select the TXIF and TXLO frequencies appropriate for the desired output operating frequency.

"SPUR SHIFTING" USING EXTERNAL SYNTHESIZER WITHOUT REQUIRING ADDITIONAL COMPONENTS

Figure 12B:
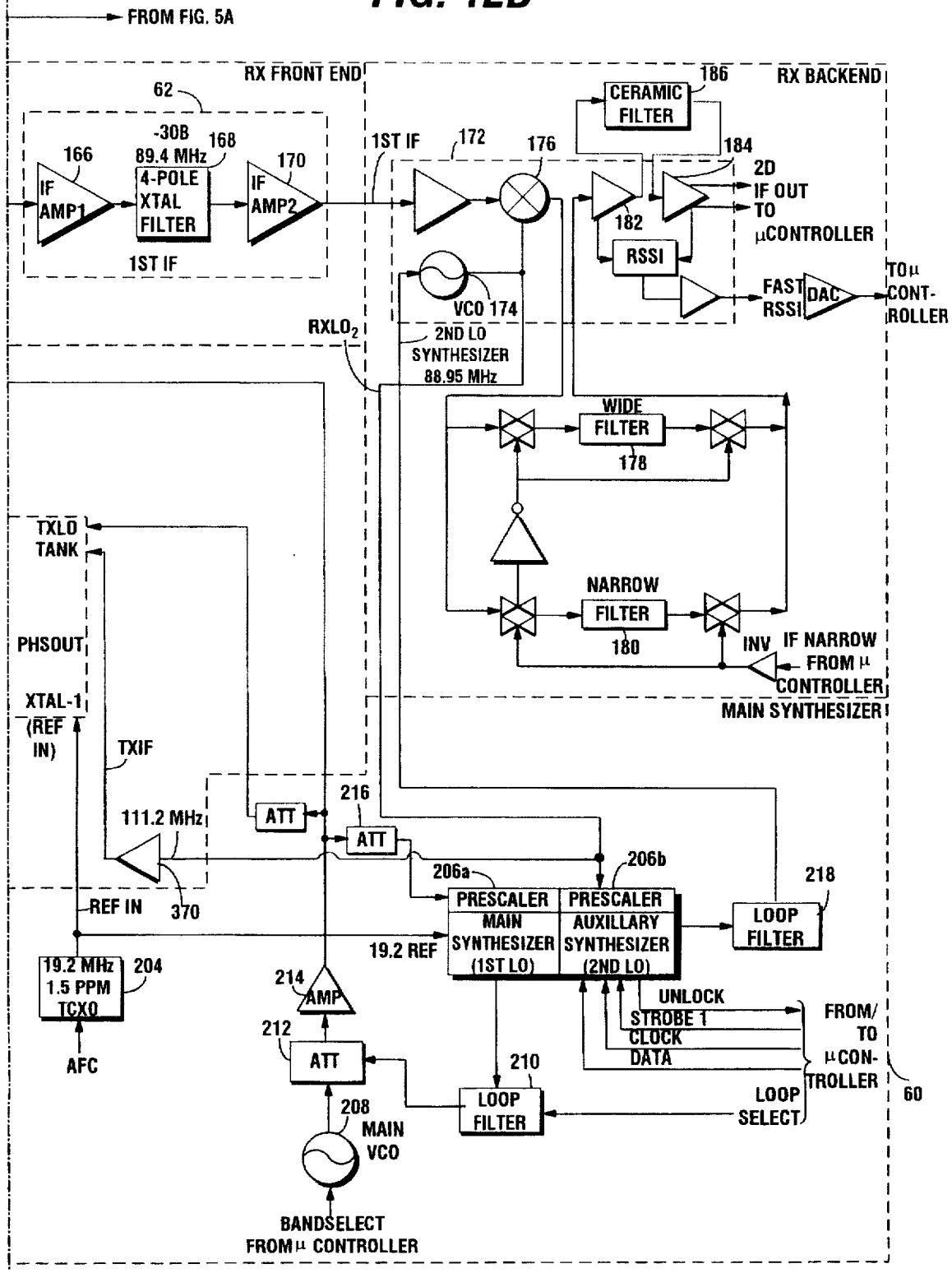
FIG. 12b shows a modification that allows the TXIF reference input signal to be derived from a receiver synthesizer signal (there is no FIG. 12a)

Although the FIG. 9 example requires additional components to implement, it might be possible in some applications to provide a programmable TXIF signal by sharing other components already existing in transceiver 150. Looking at FIG. 5b, one can see that auxiliary synthesizer/prescaler 206b is used solely for receiver second mixer 176 local oscillator injection in this particular implementation. It is possible that this auxiliary synthesizer/prescaler 206b might be used also to generate the TXIF signal during transmit mode. Combining FIGS. 5a and 12b together (in the manner shown in FIG. 12) shows one such possible modification along these lines.

In this example, the path from TXIF oscillator tank 192 to the TXIF input of transmit modulator 100 of FIG. 5a is eliminated and is replaced by a signal path from the VCO 174 output of receiver chip 172 which now provides a 111.2 (nominal) Miz $TANK_{13}2$ reference input for the transmit modulator. An additional buffer amplifier 370 may be included for isolation. In this example, the prescaler/auxiliary synthesizer 206b is used during receive operation to provide the receiver second mixer 176 local oscillator injection, and during transmit to provide the transmit modulator second local oscillator frequency TXIF. During transmit operation, microcontroller/DSP 160 reprograms the auxiliary synthesizer/prescaler 206b to provide a suitable divide factor for the desired TXIF frequency, and the receiver chip VCO 174 provides the output that drives the transmit modulator internal oscillator 104, used as a buffer.

"SPUR HIDING"

Figure 13:
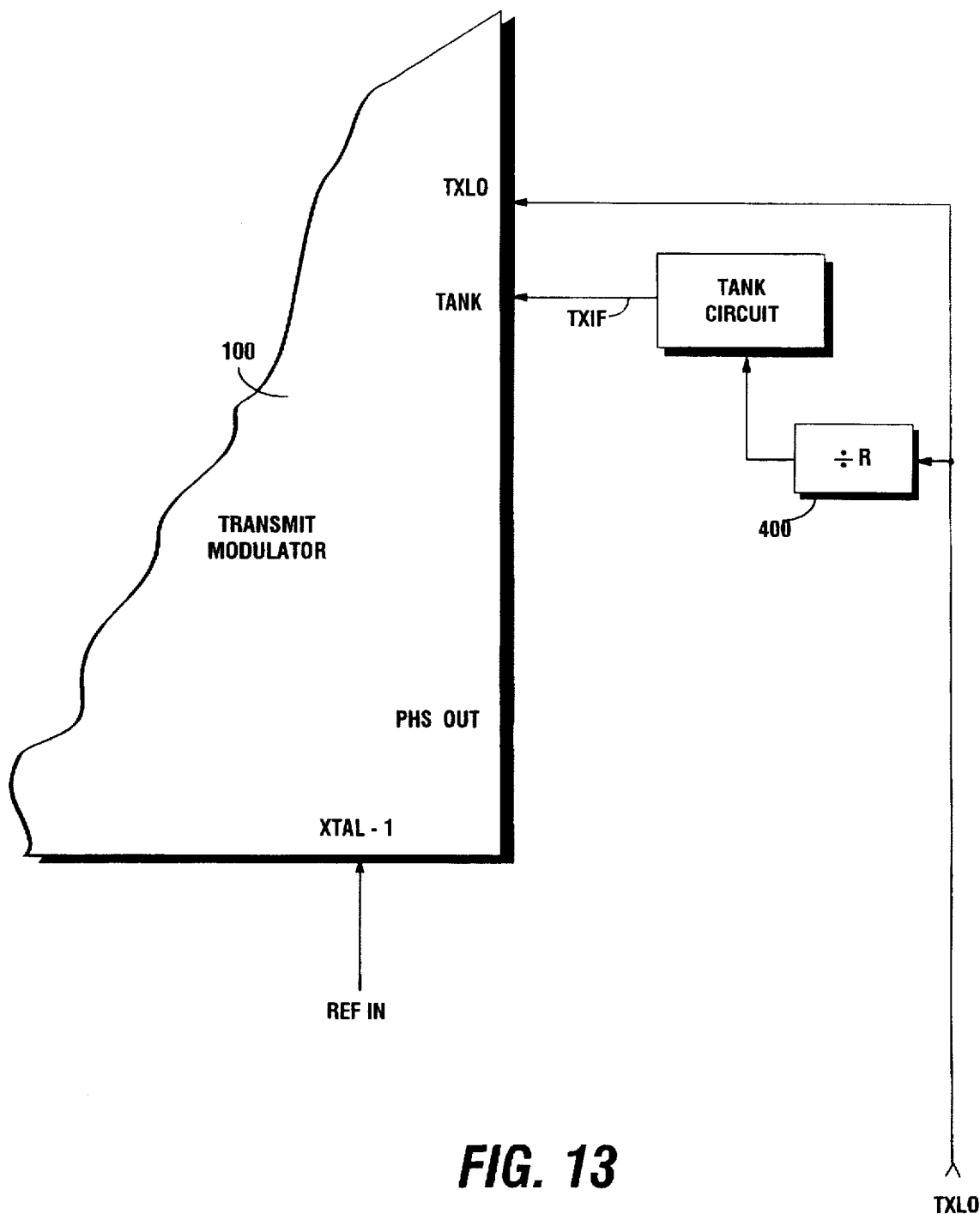
FIG. 13 shows another modification of the transceiver shown in FIGS. 5a and 5b that makes the TXLO frequency an integer multiple (harmonic) of the TXIF frequency.

Since the majority of the problematic spurs described above are of the "Able Baker" variety, relating the TXIF and TXLO frequencies by division rather than randomly will place many or all of these spurs exactly on the operating frequency. FIG. 13 shows a modification to the transceiver 150 of FIGS. 5a and 5b to accomplish this result. In the FIG. 13 modification, a connection between TXLO and the TANK input to transmit modulator 100 is made with a "/R" divider 400 that divides the TXLO local oscillator signal by a predetermined integer. In one example arrangement, R=3 (i.e., the TXLO frequency is an integer multiple of the TXIF signal, with this integer multiple being 3 so that TXLO is the third harmonic of TXIF).

Figure 14A:
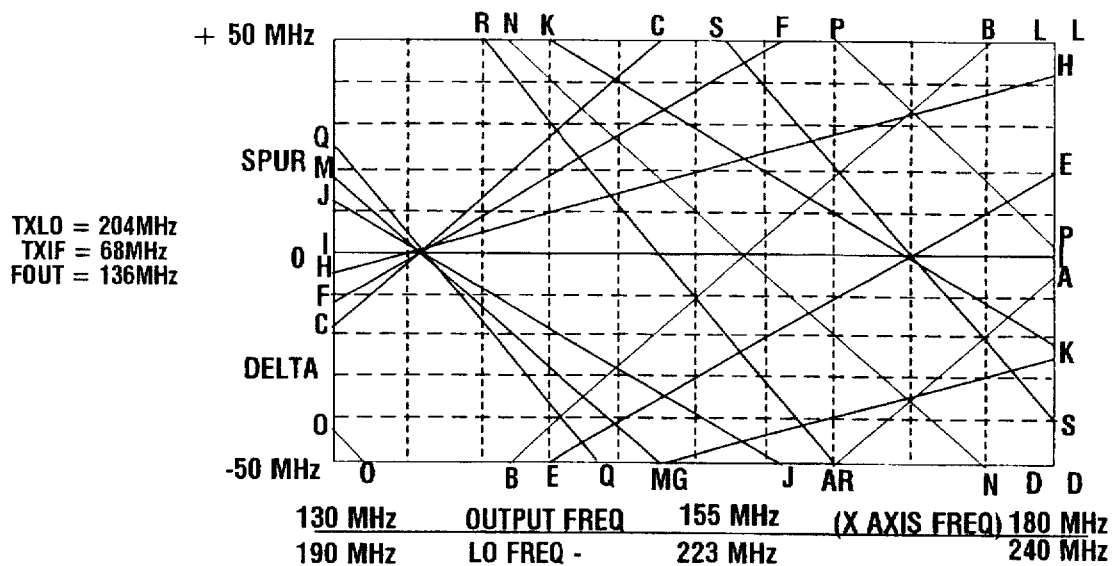
FIGS. 14a–14d show frequency plots of spurious mixer outputs for the VHF band preserving a predetermined integer relationship between TXLO and TXIF (divide by 4) with different spacings between TXLO and TXIF to provide different transmitter output frequencies.
Figure 14B:
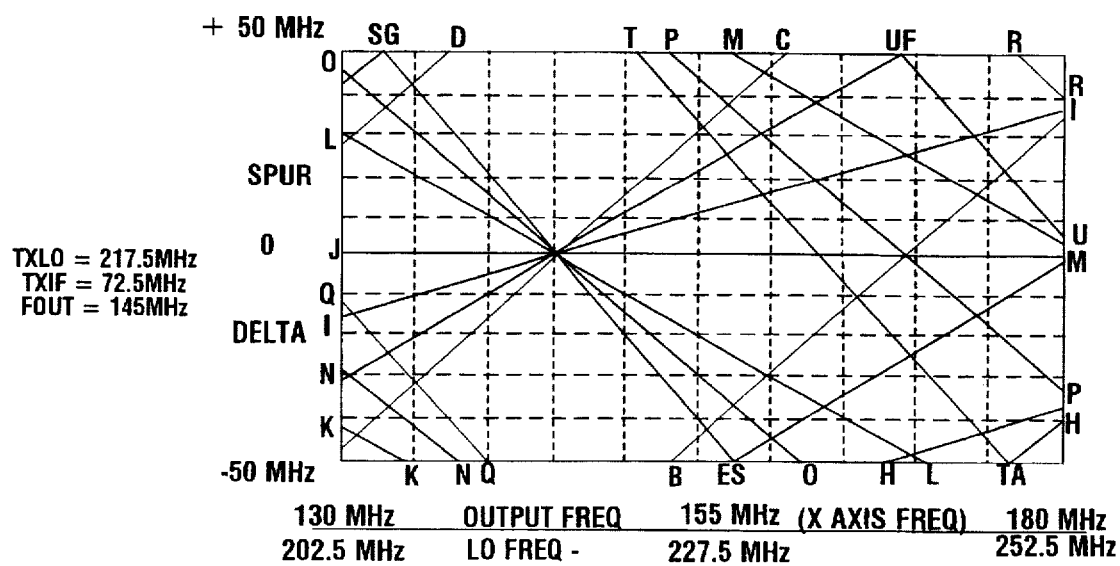
Figure 14C:
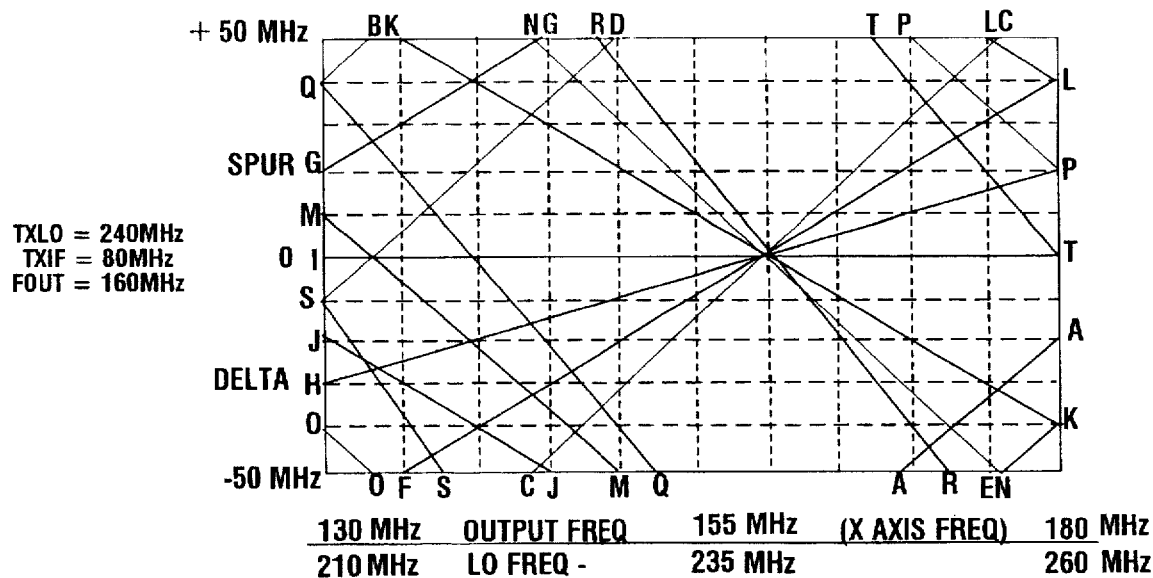
Figure 14D:
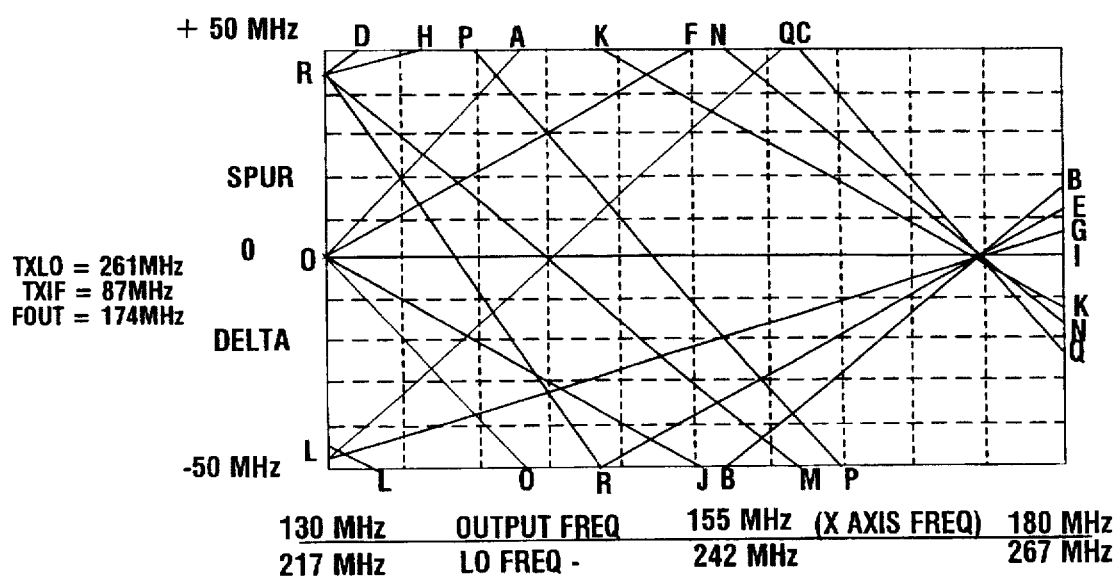

FIGS. 14a–14d show different spur patterns for different relative values of TXLO and TXIF—but maintaining the same integer multiple relationship between these two frequencies. For example, FIG. 14a plots spurious mixer outputs for TXLO=204 MHz, TXIF=68 MHz to provide an output frequency of 136 MHz. This plot shows that all of the spurious outputs near the desired 136 MHz output frequency fall exactly on the desired output frequency. Similarly, the FIG. 14b spur plot shows that all of the spurious mixer outputs generated using input signals TXLO=207.5 MHz, TXIF=72.5 MHz fall precisely on the desired 145 MHz output frequency. Similarly, FIGS. 14c and 14d show plots for output frequencies 160 MHz and 174 MHz, respectively, and further demonstrate that the spurious mixer outputs will fall precisely on the desired output frequency by maintaining the integer multiple relationship between TXLO and TXIF.

The following tables V–VII show the N, M values for the plots at FIGS. 14a–14d, respectively:

TABLE V

|   | N   | M  |
|---|-----|----|
| A | −12 | +4 |
| B | −11 | +4 |
| C | −10 | +4 |
| D | −9  | +3 |
| E | −8  | +3 |
| F | −7  | +3 |
| G | −5  | +2 |
| H | −4  | +2 |
| I | −1  | +1 |
| J | +5  | −1 |
| K | +6  | −1 |
| L | +7  | −1 |
| M | +8  | −2 |
| N | +9  | −2 |
| O | +10 | −3 |
| P | +10 | −2 |
| Q | +11 | −3 |
| R | +12 | −3 |
| S | +13 | −3 |

TABLE VI

|   | N   | M  |
|---|-----|----|
| A | −12 | +4 |
| B | −11 | +4 |
| C | −10 | +4 |

TABLE VI-continued

|   | N   | M  |
|---|-----|----|
| D | −9  | +4 |
| E | −8  | +3 |
| F | −7  | +3 |
| G | −6  | +3 |
| H | −5  | +2 |
| I | −4  | +2 |
| J | −1  | +1 |
| K | +4  | −1 |
| L | +5  | −1 |
| M | +6  | −1 |
| N | +7  | −2 |
| O | +8  | −2 |
| P | +9  | −2 |
| Q | +10 | −3 |
| R | +10 | −2 |
| S | +11 | −3 |
| T | +12 | −3 |
| U | +13 | −3 |

At a TXLO of 204 MHz, the desired frequency is 136 MHz. In this particular case, only lines C, F, H, I, J, M, and Q of the above table are present since all these cross exactly at 136 MHz (i.e., −10*(68)+4*(204)=136 for line "C," −7*(68)+3*(204)=136 for line F, etc.).

TABLE VII

|   | N   | M  |
|---|-----|----|
| A | −11 | +4 |
| B | −11 | +5 |
| C | −10 | +4 |
| D | −9  | +4 |
| E | −8  | +3 |
| F | −7  | +3 |
| G | −6  | +3 |
| H | −4  | +2 |
| I | −1  | +1 |
| J | +4  | −1 |
| K | +5  | −1 |
| L | +6  | −1 |
| M | +7  | −2 |
| N | +8  | −2 |
| O | +9  | −3 |
| P | +9  | −2 |
| Q | +10 | −3 |
| R | +11 | −3 |
| S | +12 | −4 |
| T | +12 | −3 |

TABLE VIII

|   | N   | M  |
|---|-----|----|
| A | −11 | +5 |
| B | −10 | +4 |
| C | −9  | +4 |
| D | −8  | +4 |
| E | −7  | +3 |
| F | −6  | +3 |
| G | −4  | +2 |
| H | −3  | +2 |
| I | −1  | +1 |
| J | +4  | −1 |
| K | +5  | −1 |
| L | +6  | −2 |
| M | +7  | −2 |
| N | +8  | −2 |
| O | +9  | −3 |
| P | +10 | −3 |

TABLE VIII-continued

|   | N   | M  |
|---|-----|----|
| Q | +11 | −3 |
| R | +12 | −4 |

Each of these plots thus show that at the operating frequency, there are no spurs within the ±50 MHz (note that these plots are in actuality only valid vertically at the specified operating frequency since they are plotted based on the assumption that TXLO can be varied independently of TXIF, whereas in this arrangement, TXLO and TXIF can only be varied together). The following relationships explain why this result is obtained:

$$F_{out} = \pm N(TXIF) \pm M (TXLO) \quad (2)$$

$$\text{let } TXLO = K*TXIF \quad (3)$$

then $$F_{out} = \pm N(TXIF) \pm MK(TXIF) \quad (4)$$

$$F_{out} = (\pm N \pm MK)*(TXIF) \quad (5)$$

Equation 5 shows that if K is an integer, the factor used to multiply TXLO to obtain the output frequency is also always an integer (since N and M are always integers). This means that all mixer outputs are harmonics of TXIF. At VHF and higher frequencies, the second (and higher order) harmonics of TXIF are sufficiently spaced in frequency from one another so they can easily be filtered. Any "spurious" products develop based on higher orders of N and/or M will likewise be "mapped" into harmonics of TXIF—and therefore fall onto the selected harmonic or onto non-selected (and hence filtered out) harmonics. Hence, the only component of the mixer output frequency that is not filtered out is the desired harmonic (i.e., the second harmonic in the examples shown in FIGS. 14a–14d) of TXIF.

This "spur hiding" technique has the advantage of making the TXLO steps larger than the channel steps (although it has the disadvantage of increasing the TXLO required tuning range). This technique does have some potential drawbacks however, such as, for example, possible reduction of isolation between the TXLO synthesizer output and the RF output signal, possibly increased tuning range requirements of the TXLO synthesizer, and (in some implementations) the inability to FM modulate the TXIF independently of the TXLO. In particular, the isolation between the RF output frequency and the TXLO input frequency is also reduced— this may cause VCO "pulling" in some instances. In this example, the transmit modulator 100 internal phase shift network 128 might need to be changed to operate over a different frequency range (e.g., 68–87 MHz) for certain tuning conditions.

While the invention has been described in connection with what is presently considered to be the most practical and preferred embodiment, it is to be understood that the invention is not to be limited to the disclosed embodiment, but on the contrary, is intended to cover various modifications and equivalent arrangements included within the spirit and scope of the appended claims.

What is claimed is:

1. In a radio transmitter that generates a selected one of plural transmitter output frequencies by mixing first and second mixer input frequencies, a method of reducing or eliminating spurious transmitter outputs caused by spurious products of said mixing, said method including the step of dynamically maintaining, for substantially each selected transmit frequency, at least one predetermined relationship between the first mixer input frequency and the second mixer input frequency that is independent of the difference between said first and second mixer input frequencies, said at least one predetermined relationship minimizing or eliminating at least some spurious mixer products close to said selected transmit frequency.

2. A method as in claim 1 wherein said establishing step comprises making one of said first and second frequencies an integer multiple of the other.

3. A method as in claim 1 wherein said establishing step comprises making one of said first and second frequencies a harmonic of the other.

4. A method as in claim 1 wherein said establishing step comprises:

(a) dividing a transmit operating frequency band into plural segments;

(b) determining which of said plural segments said selected transmitter output frequency falls within; and (c) selecting said predetermined relationship based on said determined segment.

5. A radio transmitter that is capable of transmitting on any of plural selectable transmitter output frequencies, the radio transmitter comprising:

a first programmable signal means for producing a first mixer input signal;

a second programmable signal means for producing a second mixer input signal;

a mixer connected to receive said first and second mixer input signals, said mixer generating a carrier output frequency based on the product of said first and second mixer input signals; and control means, coupled to at least one of said first signal means and said second signal means, for dynamically programming the combination of mixer input signal frequencies produced by said first signal and said second signal means to select a transmitter output frequency and to reduce or eliminate spurious products of said mixer that degrade the spectral purity of said transmitter output at said selected transmitter output frequency.

6. A radio transmitter as in claim 5 wherein said control means includes a microcomputer storing a lookup table, said lookup table specifying different first signal frequencies based on transmit operating band segment.

7. A radio transmitter as in claim 5 wherein said second signal means includes a programmable divider that divides said first signal frequency to produce said second signal at a frequency that is a subharmonic of said first signal frequency.

8. A radio transmitter as in claim 5 wherein said second signal means includes a programmable divider.

9. A radio transmitter as in claim 5 wherein said second signal means includes a digital frequency synthesizer.

10. A radio transceiver that operates on any of plural desired transmit frequencies within at least one transmit operating frequency band, the radio transceiver comprising:

an antenna;

radio receiving circuitry coupled, in use, to said antenna;

radio transmitting circuitry coupled, in use, to said antenna, said radio transmitting circuitry including a mixer; and a frequency synthesizing arrangement that provides first and second local oscillator signals to said mixer, said frequency synthesizing arrangement dynamically selecting the frequencies of said first and second local oscillator signals to select a desired transmit operating frequency within the transmit operating frequency band, and to minimize the likelihood that spurious outputs of said mixer will degrade the spectral purity of said transmitting circuitry output at the selected transmit operating frequency.

11. A radio transceiver as in claim 10 wherein said frequency synthesizer includes means for setting said first local oscillator signal to have a frequency that is an integer multiple of said second local oscillator signal frequency.

12. A radio transceiver as in claim 10 wherein said frequency synthesizing arrangement includes means for changing the relationship between said first local oscillator signal frequency and said second local oscillator signal frequency based on operating band segment.

13. In radio transmitting equipment of the type having an integrated circuit based mixer/modulator including an internal frequency divider, and an internal mixer, said integrated circuit receiving first and second input frequencies and mixing them together to produce a carrier at any selected one or plural output frequencies, a method of reducing harmful spurious mixer outputs comprising the step of dynamically selecting a relationship between said first and second input frequencies that is independent of the difference between them so that the input frequencies provide a desired carrier frequency when mixed by the mixer and also do not generate spurious mixer products that degrade the spectral purity of the output of said equipment.

14. In radio transmitting equipment of the type having an integrated circuit based mixer/modulator including an internal frequency divider, an internal mixer and at least one internal mixer output filter, said integrated circuit receiving first and second input frequencies and mixing them together to produce a carrier at any selected one of plural transmitter output frequencies, a method of reducing harmful spurious mixer outputs comprising the steps of:

(a) determining the segment of an operating band said selected carrier frequency falls within; and (b) dynamically controlling said first and second input frequencies in dependence on said determined operating band to both yield said selected carrier frequency and to reduce the likelihood that spurious mixer products will degrade the spectral purity of said transmitting equipment.

15. In radio transmitting equipment of the type having an integrated circuit based mixer/modulator including a frequency divider, phase detector, mixer and at least one internal mixer output filter, said equipment capable of transmitting on any selected one of plural transmit frequencies, said integrated circuit receiving first and second input frequencies and mixing them together to produce a carrier frequency, a method of reducing harmful spurious mixer outputs comprising the step of dynamically selecting the first and second input frequencies to establish a desired transmit frequency and to dynamically maintain said first input frequency to be an integer multiple of said second input frequency to thereby cause substantially all of said mixer products to be harmonically related.

16. A method of improving the spectral purity of a radio transmitter of the type capable of transmitting on any selected one of plural transmit frequencies, the method comprising:

(a) providing a first mixer input signal at a first frequency;

(b) providing a second mixer input signal at a second frequency that is harmonically related to said first frequency;

(c) mixing said first and second frequencies together to produce, at a mixer output, a carrier signal frequency and harmonics thereof;

(d) filtering said mixer output to substantially eliminate said harmonics; and (e) dynamically selecting the first and second frequencies for each of plural transmit operating frequencies to effectively shift or hide spurious mixer outputs and thereby reduce spectral impurities in the filtered mixer output.

17. A method as in claim 16 wherein step (e) includes the step of tuning said carrier signal frequency by changing both said first frequency and said second frequency to maintain said harmonic relationship therebetween.

18. A method of improving the spectral purity of a radio transmitter comprising:

(a) selecting a carrier signal frequency;

(b) providing a first mixer input signal all a first frequency;

(c) providing a second mixer input signal at a second frequency, wherein at least one of said first and second providing steps is controlled, at least in part, based on said selected carrier signal frequency;

(d) mixing said first and second frequencies together to produce, at a mixer output, said selected carrier signal frequency;

(e) filtering said mixer output; and (f) dynamically selecting at least one of said first and second frequencies based on carrier signal frequency to minimize spurious mixer outputs that cannot be sufficiently filtered by said filtering step (e).

19. A method as in claim 18 wherein said step (f) includes dynamically selecting said first frequency based on a determination of which segment of an operating band said carrier signal frequency falls within.

20. A method as in claim 18 wherein said step (f) includes dividing at least one operating band into plural segments, and specifying said first frequency based on which of said plural segments said carrier signal frequency lies within.

21. In a digital radio including a local oscillator providing a first mixer input signal, a voltage controlled oscillator providing a second mixer input signal, a mixer, and an image reject filter, the mixer being connected to receive the first and second mixer input signals, at least the mixer and the image reject filter being disposed on the same integrated circuit chip, the on-chip image reject filter having a bandwidth that passes any mixer frequency output within a predetermined transmitter operating frequency band width spanning plural discrete selectable transmitter operating channels, the first mixer mixing together the first and second mixer input signals to generate a mixer output at a frequency that corresponds to a desired selected transmitter operating channel, a method of operating the radio including the step of dynamically selecting both the first mixer input frequency and the second mixer input frequency to provide a desired mixer output frequency and to also ensure that the frequencies of any mixer byproducts having more than negligible amplitude will either be the same as the desired mixer frequency output or fall outside of the image reject filter passband, to thereby reduce spectral impurities in the filtered mixer output.

* * * * *